(12) United States Patent
Zachariah et al.

(10) Patent No.: US 6,598,211 B2
(45) Date of Patent: Jul. 22, 2003

(54) SCALEABLE APPROACH TO EXTRACTING BRIDGES FROM A HIERARCHICALLY DESCRIBED VLSI LAYOUT

(75) Inventors: Sujit T. Zachariah, Santa Clara, CA (US); Sreejit Chakravarty, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 16 days.

(21) Appl. No.: 09/823,807

(22) Filed: Mar. 30, 2001

(65) Prior Publication Data

US 2002/0144219 A1 Oct. 3, 2002

(51) Int. Cl.$^7$ ............................................. G06F 17/50
(52) U.S. Cl. ............................................. 716/4; 716/5
(58) Field of Search ........................ 716/4, 3, 2, 1, 716/8, 21, 20, 19, 18, 17, 16, 15, 14, 13, 12, 11, 10, 9, 7, 6, 5

(56) References Cited

U.S. PATENT DOCUMENTS

| | | | | |
|---|---|---|---|---|
| 5,987,240 A | * | 11/1999 | Kay | 716/5 |
| 6,009,251 A | * | 12/1999 | Ho et al. | 716/5 |
| 6,011,911 A | * | 1/2000 | Ho et al. | 716/5 |
| 6,230,299 B1 | * | 5/2001 | McSherry et al. | 716/1 |
| 6,289,412 B1 | * | 9/2001 | Yuan et al. | 711/11 |
| 6,223,329 B1 | * | 4/2002 | Ling et al. | 716/7 |
| 6,418,551 B1 | * | 7/2002 | Mckay et al. | 716/5 |

OTHER PUBLICATIONS

F. M. Goncalves, I.C. Teixeira, J.P. Teixeira, "Integrated Approach for Circuit and Fault Extraction of VLSI Circuits," IEEE International Symposium on Defect and Fault Tolerance in VLSI Systems, Nov. 6–8, 1996, Boston, Massachusetts, pp. 96–104.

F.M. Goncalves, I.C. Teixeira, J.P. Teixeira, "Realistic Fault Extraction for High–Quality Design and Test of VLSI Systems," IEEE International Symposium on Defect and Fault Tolerance in VLSI Systems, Oct. 20–22, 1997, pp. 29–37.

F. Joel Ferguson, John P. Shen, Extraction and Simulation of Realistic CMOS Faults using Inductive Fault Analysis, IEEE International Test Conference, 1988, pp. 475–484.

Alvin Jee and F. Joel Ferguson, "Carafe: An Inductive Fault Analysis Tool for CMOS VLSI Circuits," IEEE VLSI Test Symposuim, 1992, pp. 92–98.

Alvin Jee, David Dahle, Cyrus Baseghi and F. Joel Ferguson, "Carafe Users Manual Release Alpha.5", http://sctest.cse.ucsc.edu/carafe/user5/user.html, Jan. 24, 1996, 18 pages.

F. Preparata, M.I. Shamos, "Computational Geometry: An Introduction," Springer–Verlag, 1985, pp. 352–355.

(List continued on next page.)

Primary Examiner—Tuan T. Lam
Assistant Examiner—Hai L. Nguyen
(74) Attorney, Agent, or Firm—Cynthia T. Faatz

(57) ABSTRACT

A bridge fault extractor. For one aspect, one of a plurality of segments of a hierarchically described integrated circuit layout is flattened to produce an annotated list of rectangles. A fault list corresponding to the segment is then computed using the annotated list of rectangles. The fault list is then merged with any prior-generated fault list, and the actions of flattening, computing and merging are repeated for each of the plurality of segments to produce a fault list for the integrated circuit.

25 Claims, 20 Drawing Sheets

OTHER PUBLICATIONS

S.T. Zachariah, S. Chakravarty, C.D. Roth, "A Novel Algorithm to Extract Two–Node Bridges," Design Automation Conference, Jun. 2000, pp. 790–793.

R.E. Tarjan, "Data Structures and Network Algorithms," Society for Industrial and Applied Mathematics, 1983.

John T. Chen, "Improved Usability of Contamination–Detect–Fault–Simulation," Carnegie Mellon University Theisis, 1998.

J. Khare, W. Maly, "Inductive Contamination Analysis (ICA) with SRAM Application," International Test Conference, 1995, pp. 552–560.

E.M. McCreight, "Efficient Algorithms for Enumerating Intersecting Intervals and Rectangles," Report CSL–80–9, Xerox Palo Alto Research Center, Palo Alto, 1980.

Pranab K. Nag and Wojcieh Maly, "Hierarchical Extraction of Critical Area for Shorts in Very Large ICs, "IEEE International Workshop on Defect and Fault Tolerance in VLSI Systems, Nov. 13–15, 1995, pp. 19–27.

M. De Berg, M. Van Kreveld, M. Overmars, O. Schwarzkopf, "Computational Geometry," Springer, pp. 209–217.

* cited by examiner

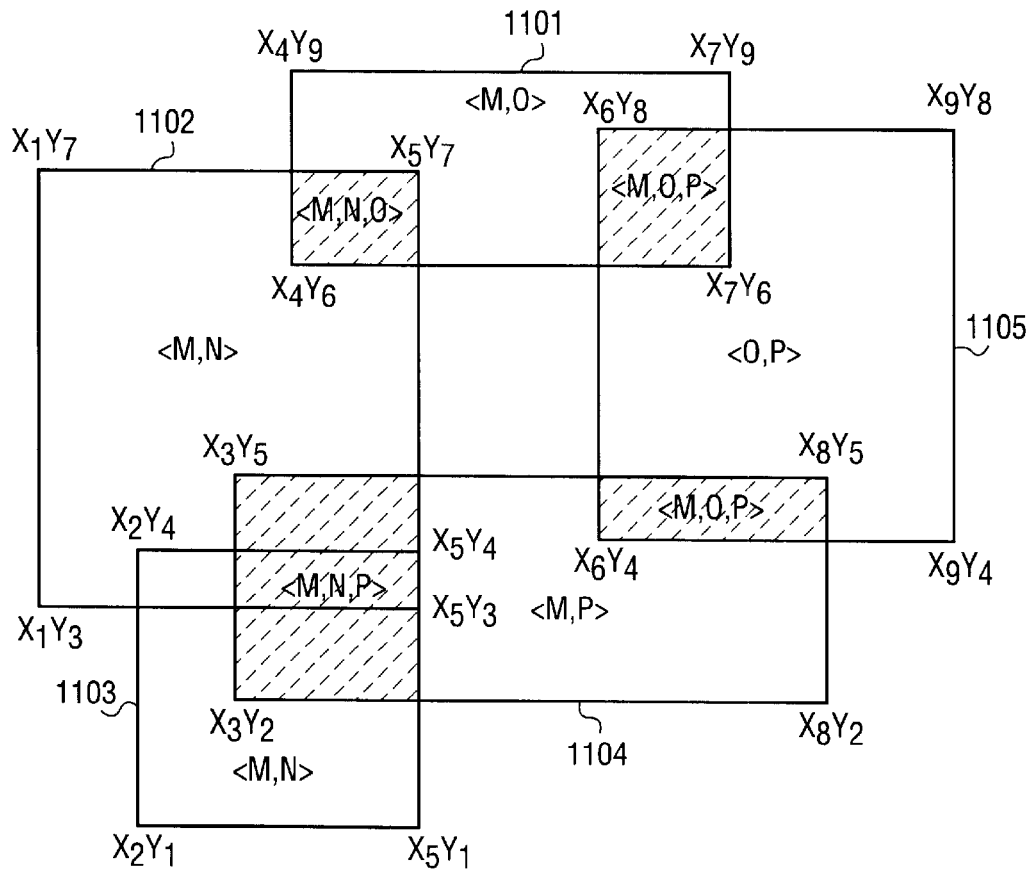

| L | $X_1$ | $X_4$ | $X_6$ |
|---|---|---|---|
| L[1]:<$X_1,Y_3$,I,B,M,N> | M[1]:<$Y_7$,T,M,N> | M[1]:<$Y_9$,T,M,O> | M[1]:<$Y_9$,T,M,O> |
| L[2]:<$X_1,Y_7$,I,T,M,N> | M[2]:<$Y_3$,B,M,N> | M[2]:<$Y_7$,T,M,N> | M[2]:<$Y_8$,T,O,P> |
| L[3]:<$X_2,Y_1$,I,B,M,N> | $X_2$ | M[3]:<$Y_6$,B,M,O> | M[3]:<$Y_6$,B,M,O> |
| L[4]:<$X_2,Y_4$,I,T,M,N> | M[1]:<$Y_7$,T,M,N> | M[4]:<$Y_5$,T,M,P> | M[4]:<$Y_5$,T,M,P> |
| L[5]:<$X_3,Y_2$,I,B,M,P> | M[2]:<$Y_4$,T,M,N> | M[5]:<$Y_4$,T,M,N> | M[5]:<$Y_4$,B,O,P> |
| L[6]:<$X_3,Y_5$,I,T,M,P> | M[3]:<$Y_3$,B,M,N> | M[6]:<$Y_3$,B,M,N> | M[6]:<$Y_2$,B,M,P> |
| L[7]:<$X_4,Y_6$,I,B,M,O> | M[4]:<$Y_1$,B,M,N> | M[7]:<$Y_2$,B,M,P> | $X_7$ |
| L[8]:<$X_4,Y_9$,I,T,M,O> | $X_3$ | M[8]:<$Y_1$,B,M,N> | M[1]:<$Y_8$,T,O,P> |
| L[9]:<$X_5,Y_1$,D,B,M,N> | M[1]:<$Y_7$,T,M,N> | $X_5$ | M[2]:<$Y_5$,T,M,P> |
| L[10]:<$X_5,Y_3$,D,B,M,N> | M[2]:<$Y_5$,T,M,P> | M[1]:<$Y_9$,T,M,O> | M[3]:<$Y_4$,B,O,P> |
| L[11]:<$X_5,Y_4$,D,T,M,N> | M[3]:<$Y_4$,T,M,N> | M[2]:<$Y_6$,B,M,O> | M[4]:<$Y_2$,B,M,P> |
| L[12]:<$X_5,Y_7$,D,T,M,N> | M[4]:<$Y_3$,B,M,N> | M[3]:<$Y_5$,T,M,P> | $X_8$ |
| L[13]:<$X_6,Y_4$,I,B,O,P> | M[5]:<$Y_2$,B,M,P> | M[4]:<$Y_2$,B,M,P> | M[1]:<$Y_8$,T,O,P> |
| L[14]:<$X_6,Y_8$,I,T,O,P> | M[6]:<$Y_1$,B,M,N> | | M[2]:<$Y_4$,B,O,P> |
| L[15]:<$X_7,Y_6$,D,B,M,O> | | | |
| L[16]:<$X_7,Y_9$,D,T,M,O> | | | |
| L[17]:<$X_8,Y_2$,D,B,M,P> | | | |
| L[18]:<$X_8,Y_5$,D,T,M,P> | | | |
| L[19]:<$X_9,Y_4$,D,B,O,P> | | | |
| L[20]:<$X_9,Y_8$,D,T,O,P> | | | |

FIG. 16

[X₁] (AT BLOCK 830)

| | S | P | R | NETS INPINR? | CALC AREA? |
|---|---|---|---|---|---|
| J=1 | <M,N> | <M,N> | <∅> | N | N |
| J=2 | <∅> | <∅> | <M,N> | N | Y |

[X₂]

| | S | P | R | NETS INPINR? | CALC AREA? |
|---|---|---|---|---|---|
| J=1 | <M,N> | <M,N> | <∅> | N | N |
| J=2 | <M,N,M,N> | <M,N,M,N> | <M,N> | Y | N |
| J=3 | <M,N> | <M,N> | <M,N,M,N> | Y | N |
| J=4 | <∅> | <∅> | <M.N> | N | Y |

[X₃]

| | S | P | R | NETS INPINR? | CALC AREA? |
|---|---|---|---|---|---|
| J=1 | <M,N> | <M,N> | <∅> | N | N |
| J=2 | <M,N,M,P> | <M,N,M,P> | <M,N> | N | Y |
| J=3 | <M,N,M,P,M,N> | <M,N,M,P,M,N> | <M,N,M,P> | Y | N |
| J=4 | <M,N,M,P> | <M,N,M,P> | <M,N,M,P,M,N> | Y | N |
| J=5 | <M,N> | <M,N> | <M,N,M,P> | N | Y |
| J=6 | <∅> | <∅> | <M,N> | N | Y |

⋮

[X₅]

| | S | P | R | NETS INPINR? | CALC AREA? |
|---|---|---|---|---|---|
| J=1 | <M,O> | <M,O> | <∅> | N | N |
| J=2 | <∅> | <∅> | <M,O> | N | Y |
| J=3 | <M,P> | <M,P> | <∅> | N | Y |
| J=4 | <∅> | <∅> | <M,P> | N | Y |

SAMPLE LIST Q (UNSORTED)

M,N: $[Y_7 - Y_3]*[X_2 - X_1] + [Y_7 - Y_1]*[X_3 - X_2] + [Y_7 - Y_5]*[X_4 - X_3] + \cdots$
M,N,P: $[Y_5 - Y_2]*[X_4 - X_3] + [Y_5 - Y_2]*[X_5 - X_4]$
M,N,O:
⋮

FIG. 17

(A) STATIC-INTERVAL-TREE (B) DYNAMIC-INTERVAL-TREE AFTER INSERTION OF THE FIRST THREE SEGMENTS: <1,3>,<5,6>,<2,4>

(C) DYNAMIC-INTERVAL-TREE AFTER INSERTION OF <4,6>

(D) EXAMPLE SET OF RECTANGLES

| EVENT | X | SEGMENTS |
|---|---|---|
| INSERT | 1 | R1 (1,3) |
| INSERT | 2 | R2 (2,4) |
| DELETE | 3 | R1 (1,3) |
| INSERT | 4 | R3 (5,6) |
| DELETE | 4 | R2 (2,4) |
| INSERT | 5 | R4 (2,7) |
| INSERT | 6 | R5 (1,3) |
| DELETE | 6 | R1 (5,6) |
| DELETE | 7 | R4 (2,7) |
| DELETE | 9 | R1 (1,3) |

FIG. 20E

SCALEABLE APPROACH TO EXTRACTING BRIDGES FROM A HIERARCHICALLY DESCRIBED VLSI LAYOUT

CROSS-REFERENCE TO RELATED APPLICATIONS

This application is related to application Ser. No. 09/475,714, filed Dec. 30, 1999 entitled "A METHOD AND APPARATUS FOR EXTRACTING BRIDGES FROM AN INTEGRATED CIRCUIT LAYOUT", and to application Ser. No. 09/422,119 filed Nov. 17, 1999 entitled "A METHOD AND APPARATUS FOR EXTRACTING BRIDGES FROM AN INTEGRATED CIRCUIT LAYOUT".

BACKGROUND

1. Field

An embodiment of the present invention relates to the field of analysis of defects in integrated circuits and, more particularly, to extracting likely bridge sites.

2. Discussion of Related Art

A component of defect analysis is a process used to identify areas of an integrated circuit that are more likely to be adversely affected by a manufacturing defect. The output of this process is used to design manufacturing tests targeted at detecting failures that may result from such defects.

A list of bridges, for example, may be identified during defect analysis. A bridge occurs due to a point defect that extends across two or more conductive lines or nets to cause an electrical short between them.

The likelihood of occurrence of a particular bridge may be measured by its weighted critical area (WCA). The critical area for a two net bridge for a given defect size, as the term is used herein, is the area over which the center of the defect can lie and cause the two nets to bridge. The WCA of two nets is defined as the sum of the critical areas for a particular defect size weighted by the probability of occurrence of that defect size.

Carafe, developed at the University of California, Santa Cruz, is an example of such a tool that may be used to extract potential bridges. For each layer and each adjacent layer pair in a flattened layout of an integrated circuit, Carafe generates fault primitives referred to as "length-widths." Then, for each defect size to be analyzed, Carafe calculates corresponding critical areas from each of the length-widths. These critical areas are merged or intersected for an entire layer or layer pair to produce the critical area contribution of two-net bridges for the layer or layer pair for the particular defect size. The critical areas for each layer and layer pair for that defect size are then added together to find the overall critical area for the defect size. This overall critical area is then weighted with corresponding defect data to produce the WCA for the defect size. The above-described method is repeated for each defect size.

LOBS is another example of a prior fault extraction tool. LOBS uses a sliding window algorithm to identify critical areas. LOBS places a "window" at one corner of a flattened layout in a layer or layer pair. A small set of rules is then used to calculate the critical area contributions from the region of the layout within the window. The window is then shifted to an adjacent area and the process is repeated until the entire layout has been covered.

Both Carafe and LOBS rely on a flattened version of a layout (i.e. a layout that is represented geometrically), wherein the features are annotated with the names of the nets to which they belong. This limits the size of circuits that can be handled due to memory constraints. For some of today's integrated circuits, for example, it may not be possible to produce a flattened layout representing an entire chip and/or a flattened layout may be so large that it may not be possible with current tools to calculate weighted critical areas.

CREST, developed at Carnegie Mellon University, is another example of a prior fault extraction tool. CREST calculates the WCA of bridges from a hierarchical layout description. By using a hierarchical layout description instead of a flattened layout as used by Carafe, CREST may potentially be able to handle larger layout databases. In doing so, however, CREST may sacrifice accuracy in computing WCA values and may fail to identify important bridges that could be identified using the flattened layout. CREST may also compromise accuracy of WCA calculations by assuming that the layout does not contain "over the cell" or "through the cell" routing. Further, CREST does not provide for layouts in which features are only partially labeled and/or some features may have multiple names depending on which area of the chip the feature is traversing.

Thus, the particular extraction tool used to identify likely bridges can have a significant impact on the accuracy and efficiency of the fault extraction process. Inaccurate fault extraction may compromise the quality of integrated circuit tests developed based on the output of the fault extraction. Inefficient fault extraction may take an excessive amount of time such that it is not feasible to completely analyze larger, more complex circuits.

As integrated circuits continue to increase in complexity, fault extraction using prior fault extraction tools may become increasingly difficult.

BRIEF DESCRIPTION OF THE DRAWINGS

The present invention is illustrated by way of example and not limitation in the figures of the accompanying drawings in which like references indicate similar elements, and in which:

FIGS. 3A–C show exemplary approaches to segmenting an integrated circuit layout for one embodiment.

FIG. 16 is a diagram showing an example of four overlapping critical areas that correspond to various net-name pairs and data that may be used to determine critical in the multi-net analysis mode.

FIG. 17 shows exemplary data that may be used to determine critical areas of bridges according to the methods shown in FIGS. 18 and 19 and an exemplary list of critical areas that may be produced as a result.

FIG. 20e includes exemplary data from FIG. 20d that may be used to determine rectangle intersection according to the approach(es) shown in FIGS. 20a–c.

DETAILED DESCRIPTION

A method and apparatus for extracting bridges from an integrated circuit layout are described. In the following description, particular system configurations and critical area configurations are described for purposes of illustration. It will be appreciated, however, that other embodiments are applicable to other types of systems and to critical areas arranged in another manner.

For one embodiment, a computer-implemented method includes flattening one of a plurality of segments of a hierarchically described integrated circuit layout to produce an annotated list of rectangles. Flattening one segment of the integrated circuit layout at a time is referred to herein as partial flattening. A fault list corresponding to the segment is then computed using the annotated list of rectangles and merged with any prior-generated fault list. The actions of flattening, computing and merging are then repeated for each of the plurality of segments to produce a fault list for the integrated circuit.

Using the above approach, less storage space may be required for bridge fault extraction as compared to some prior approaches. In this manner, embodiments of the present invention may provide for bridge fault extraction even for very large layouts and/or a large number of defect sizes. These benefits may be realized while providing good accuracy such that tests developed as a result of this bridge fault extraction may be targeted to realistic bridge faults.

Figure 1:
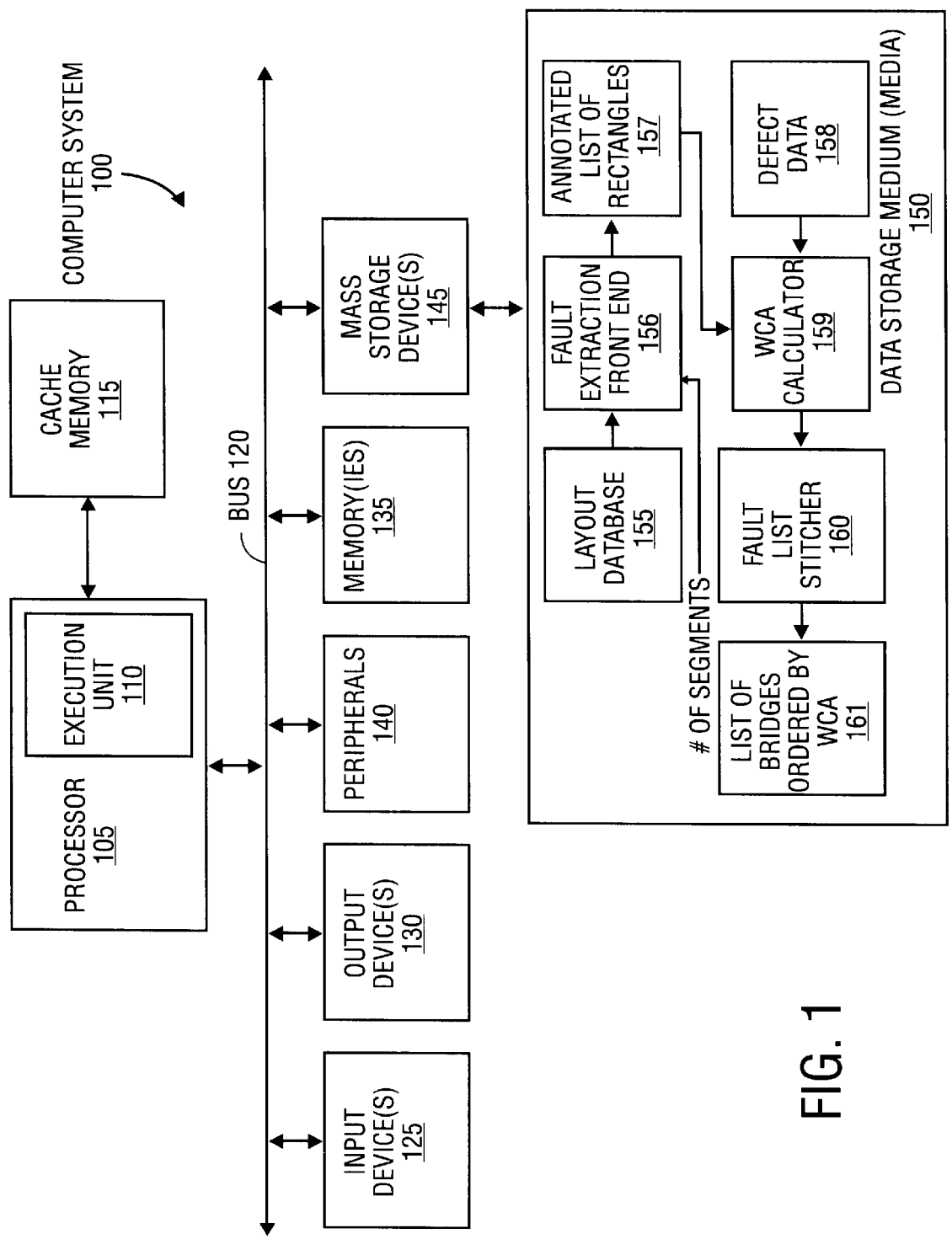
FIG. 1 is a block diagram of a computer system in which the bridge fault extraction tool of some embodiments, including a weighted critical area calculator and fault list stitcher, may be implemented.

FIG. 1 is a block diagram of a computer system 100 in which the bridge fault extraction method and apparatus of some embodiments may be implemented. For this embodiment, the computer system 100 is a workstation computer system such as a Hewlett Packard HP 9000 Enterprise Server manufactured by Hewlett Packard Company of Palo Alto, Calif. Other types of workstations, computer systems and/or other types of machines capable of executing instructions are within the scope of various embodiments.

The computer system 100 includes a processor 105 that executes instructions using an execution unit 110. A cache memory 115 may be coupled to the processor 105 to store recently and/or frequently used instructions. The processor 105 is coupled to a bus 120 to communicate information between the processor 105 and other components in the computer system 100.

Also coupled to the bus 120 are one or more input devices 125, such as a keyboard and/or a cursor control device, one or more output devices 130, such as a monitor and/or printer, one or more memories 135 (e.g. random access memory (RAM), read only memory (ROM), etc.), other peripherals 140 (e.g. memory controller, graphics controller, bus bridge, etc.), and one or more mass storage devices 145.

The mass storage device(s) 145 may include a hard disk drive, a compact disc read only memory (CD ROM) drive and/or an optical disk drive, for example. Further, the mass storage device(s) 145 may include additional mass storage device(s) that are accessible by the computer system 100 over a network (not shown).

A corresponding data storage medium (or media) 150 (also referred to as a computer-accessible or machine-accessible storage medium) may be used to store instructions, data and/or one or more programs to be executed by the processor 105. For one embodiment, the data storage medium (or media) 150 stores information and programs 155–161 of one embodiment that are used to perform bridge fault extraction. For an alternative embodiment, information and/or programs 155–161 may be provided to the computer system 100 in another manner such as, for example, via a down-the-wire or broadcast delivery mechanism of any sort.

For these embodiments, a layout database 155 is provided to a fault extraction front end 156. The fault extraction front end 156 of one embodiment receives input indicating the number of segments into which the integrated circuit layout is to be divided. The fault extraction front end 156 then produces a partially flattened layout for one segment of the integrated circuit layout in the form of an annotated list of rectangles 157.

The list of rectangles is annotated to indicate X and Y coordinates in the layout for at least two diagonally opposite corner points of each rectangle and, for some embodiments, all four corner points of each rectangle. The X and Y coordinates of each rectangle corner point may be specified relative to a selected corner of the integrated circuit layout for one embodiment. Other approaches to indicating the relative positions of the rectangles in the layout are within the scope of various embodiments. The annotations for one embodiment further indicate a net-name for each rectangle that corresponds to a net. The net-name identifies the particular net or signal (e.g. memory read signal, bit 0 of front-side bus, etc.) with which a rectangle is associated. For one embodiment, net-names may be assigned by the designer during the process of developing the layout and are provided in the layout itself. One embodiment of the fault extraction front end 156 also provides for net name propagation as described in more detail below.

Defect data 158 indicates defect distributions for the fabrication process to be used to produce the integrated circuit that is the subject of fault extraction. Point defects are assumed for one embodiment. The defect data 158 indicates a probability of occurrence of defects of different sizes to be used in the fault extraction process.

The annotated list of rectangles 157 and defect data 158 are provided to a WCA calculator 159. The WCA calculator 159 operates in the manner described below to produce an intermediate list of realistically possible two-net and/or multi-net bridges ordered by WCA.

The process of partially flattening and calculating a corresponding prioritized list of WCAs is repeated for each segment of the integrated circuit layout for all layers and layers pairs of each segment. For second and subsequent segments that are processed, a fault list stitcher 160 operates to merge the fault list of a segment being processed with a prior fault list in the manner described below. This approach is used to identify both intralayer and interlayer faults as described in more detail below.

When all layers and layer pairs for all segments have been processed, a fault list or list of bridges 161 ordered by WCA and corresponding to the entire integrated circuit layout is produced. For one embodiment, the final fault list 161 and each of the intermediate fault lists is limited to the top N faults as prioritized by weighted critical area. The list of bridges 161 may then be used to develop manufacturing tests, perform fault diagnosis, etc. Additional details are provided in the discussion that follows.

For an alternative embodiment, the functions performed by one or more of the blocks 156, 159 and/or 160 may be implemented in hardware.

Figure 2:
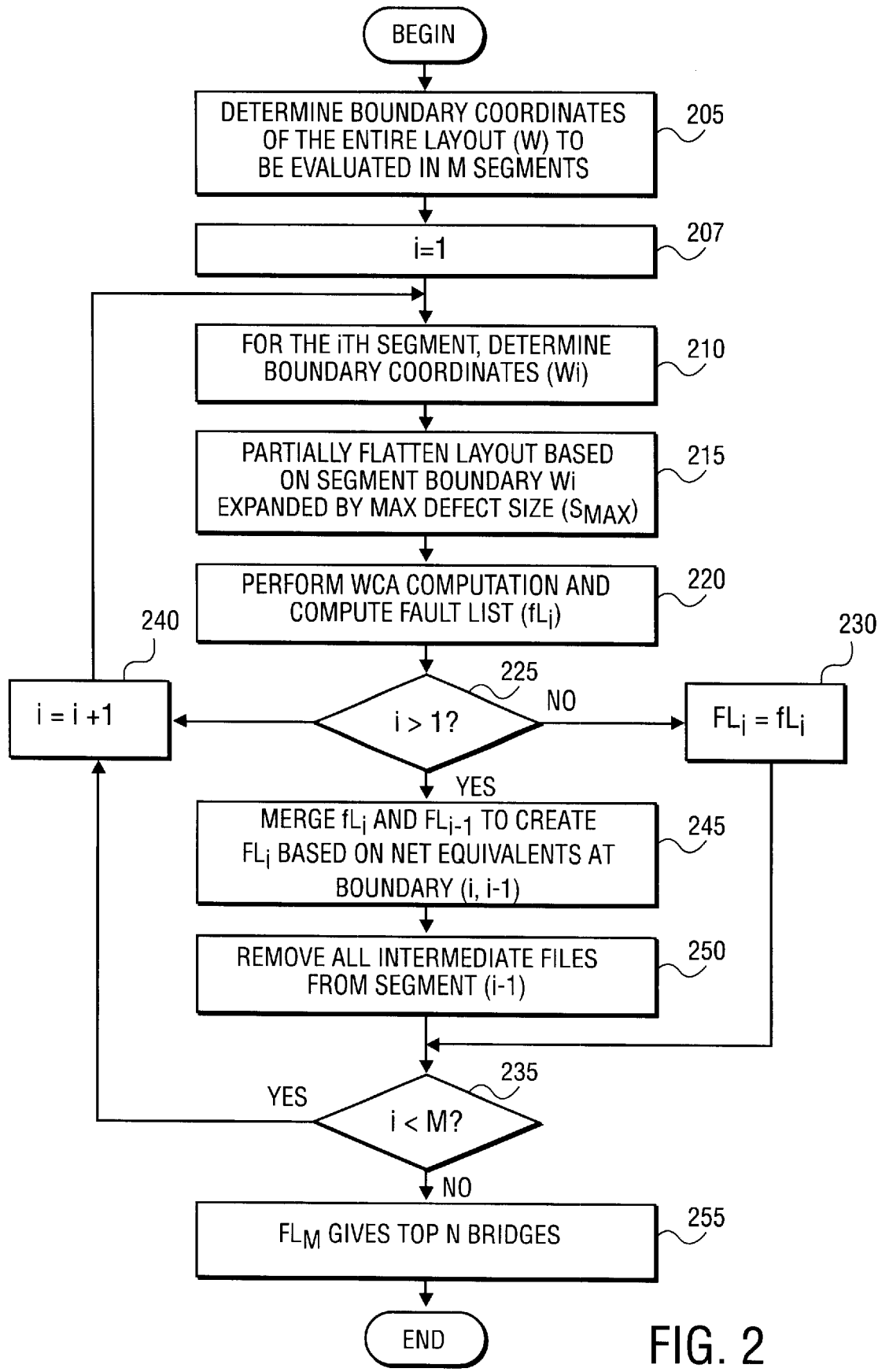
FIG. 2 is a flow diagram showing the method of one embodiment for producing a prioritized fault list using a partial flattening approach.

FIG. 2 is a flow diagram showing the method of one embodiment for performing bridge fault extraction from a hierarchically described layout.

For this embodiment, the following assumptions have been made: 1) Defects are assumed to be random defects. 2) Defects causing bridges between nets on the same layer are assumed to be rectangular in shape. 3) Defects causing bridges between nets on different layers are assumed to be parallelepiped in shape. 4) The probability that a defect can lie at a given location in a plane is uniformly distributed.

For a hierarchically described integrated circuit layout, at processing block 205, the boundary coordinates (W) of the entire layout are determined. For one embodiment, these boundary coordinates are specified in terms of the X and Y coordinates of the lower left corner point and the upper right corner point of the bounding rectangle of the layout.

At processing block 205, the number of segments into which the layout is to be divided is determined. For one embodiment M is provided as an input parameter to the fault extraction front end 156 (FIG. 1). The value of M is constrained by the available memory. For example, M may be chosen such that both flattening and bridge extraction in the manner described below are possible for each of the M segments given the available memory.

Figures 3A, 3B, 3C:
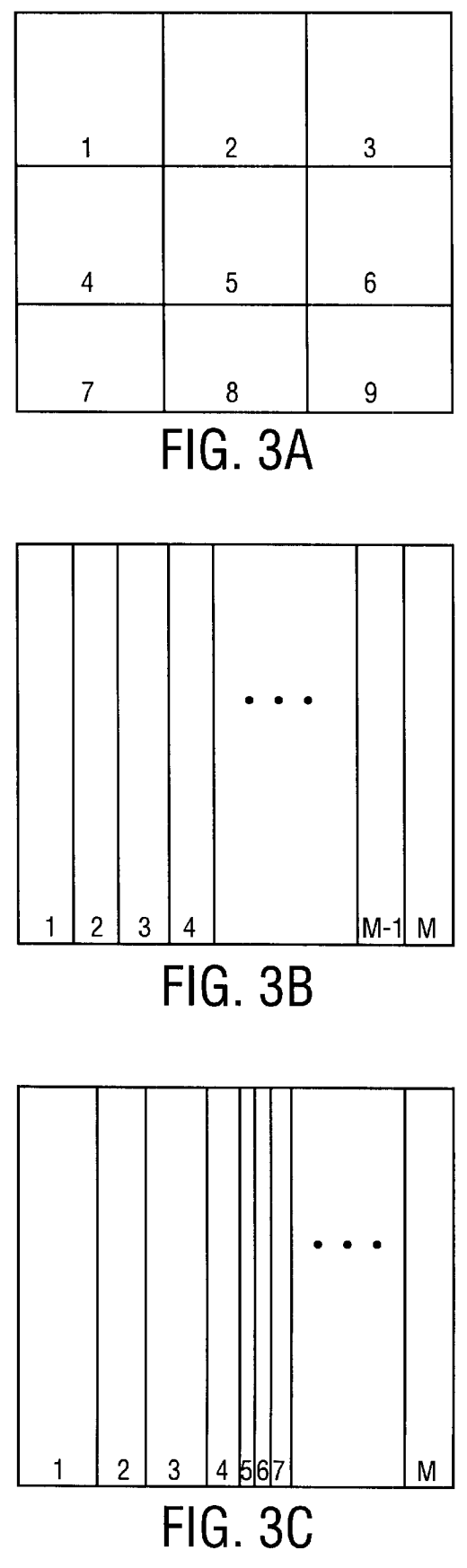

The integrated circuit layout may be segmented either along one axis (e.g. the X-axis as shown in FIGS. 3B and 3C) or along both axes (as shown in FIG. 3A where, for purposes of example, M is equal to 9). It will be noted, however, that for each segment, both the flattened version of the segment layout and the fault list corresponding to the segment need to be maintained until all adjacent segments involving the segment are processed, as described in more detail below.

Where the layout is segmented along two axes as shown, for example, in FIG. 3A, each segment may have several such adjacent segments such that the fault list and flattened version of the layout for several segments may need to be stored concurrently. Where the layout is segmented along just one axis, however, the flattened version of the segment layout and the segment fault list only need to be maintained until the subsequent segment is processed thereby reducing intermediate storage requirements. For this reason, in the description that follows, reference is made to segmentation along one axis for purposes of example. It will be appreciated, however, that for other embodiments, the layout may be segmented in another manner.

The variable i is used herein to indicate the particular one of the M segments being processed. At processing block 207, i is initialized and at processing block 210, the boundary coordinates $\{(x_{1i}, y_{1i})$ and $(x_{2i}, y_{2i})\}$ for the ith segment ($w_i$) are determined. Where the M segments are equal in size as shown in FIG. 3B, segment boundaries may be generated from the boundary coordinates of the entire layout with very little computation. For this case, however, the number of segments M may be large depending on density distribution of the layout. This is because the value of M is dictated by the fact that the maximum memory usage requirement of any segment should be within the available memory limit.

Thus, for an alternative embodiment, segments may be generated based on quick and approximate density distribution calculations to be unequal in size as shown, for example, in FIG. 3C. Because the central region of the layout tends to be more densely populated than the periphery, segments in that region can be smaller in area (narrower where segments are along one axis) than other segments. In this manner, memory usage across all the segments may be more uniform, and it may be possible to use a smaller number of segments.

At processing block 215, the hierarchically described integrated circuit layout is partially flattened. The term partially flattened refers to the fact that during this process, only the ith one of M segments is flattened. (Data corresponding to one or more previously flattened segments may also be available during this processing as described in more detail below). This partial flattening is accomplished using bounding box flattening.

Figure 4:
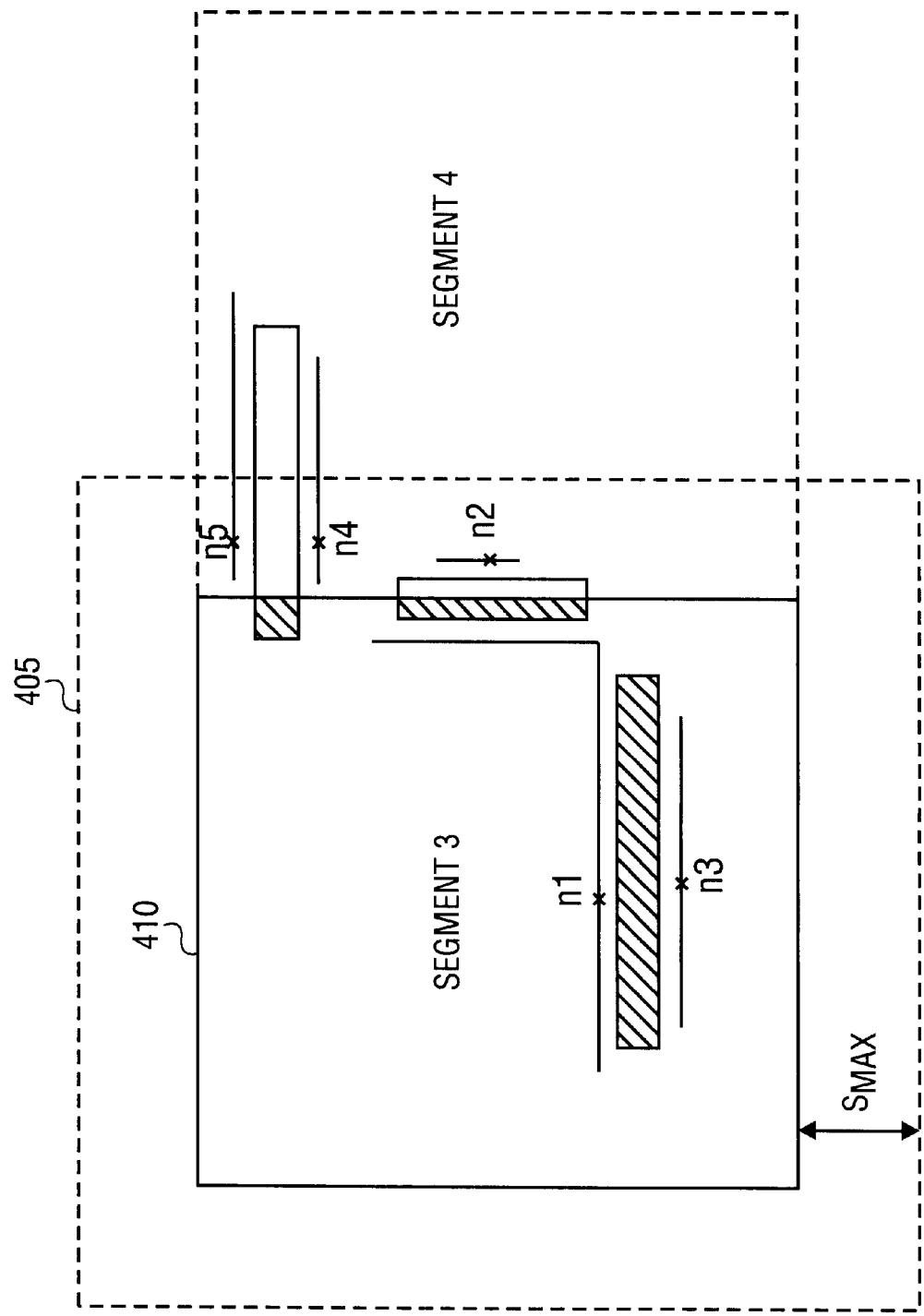
FIG. 4 is a plan view of two exemplary segments of a layout to be processed including exemplary critical areas and nets.

Referring to FIG. 4, the boundary for evaluation 405 (referred to herein as the expanded bounding box or expanded segment bounding box) for an exemplary segment 3 is determined by expanding the segment boundary 410 (also referred to as the segment bounding box) by the maximum defect size ($S_{max}$) to be evaluated. Where the defect is represented as a square, $S_{max}$ is equal to one half the length of the side of the square (also referred to herein as the radius of the maximum defect size). Once the expanded bounding box is determined, the portion of the hierarchically described layout within the expanded bounding box is flattened to produce rectangles annotated with net names as mentioned above.

Referring back to FIG. 2, after expanding and flattening the ith segment, at processing block 220, weighted critical area (WCA) calculations are performed to compute a fault list ($fl_i$) corresponding to the segment (which may be referred to herein as an intermediate fault list). For one embodiment, the WCA calculations are performed using a two-net bridge analysis approach such as the two net bridge analysis approach described below in reference to FIGS. 6–12 and 19. For other embodiments, the WCA calculations are performed using a multi-net analysis mode such as that described below in reference to FIGS. 13–19. For these approaches, each segment is processed for all defect sizes to be evaluated and for all layers and layer pairs to identify both intralayer and interlayer faults for the segment before moving on to the next segment. Using either of these approaches, resulting bridges are identified by the net names with which they are associated. For example, where WCAs are calculated using the two-net analysis approach described below, net name pairs (e.g. <n1,n2>) are used to identify the extracted bridges. For other embodiments, other types of approaches to performing WCA calculations may be used.

Referring again to FIG. 4, when computing the fault list $fl_i$ for the segment i (segment 3 in the example of FIG. 4), only critical areas lying within the segment bounding box 410 are considered. This approach avoids counting critical areas (CAs) multiple times. Thus, the shaded regions in FIG. 4, for example, are the CA regions considered in the computation of the fault list fl3 for segment 3. The critical area lying between exemplary nets n1 and n3 lies completely within segment 3 and is thus considered when computing the fault list $fl_3$. The critical area between nets n1 and n2, however, lies partially outside the segment bounding box and is therefore cropped before computing the WCA for the bridge <n1,n2> for $fl_3$. The unshaded portion of this CA is considered for the bridge <n1, n2> when processing segment 4.

It will also be noted that critical areas for a particular segment may result from rectangles of nets that lie outside the segment bounding box. An example of such a critical area is the CA corresponding to the bridge <n4, n5>. Both n4 and n5 lie outside the segment bounding box for segment 3. The corresponding CA, however, lies partially within segment 3 since the rectangles lie within $S_{max}$ of the boundary of the segment as described below. For this reason, as described above, the expanding bounding box is used to define the boundary of a segment for flattening purposes.

For one embodiment, WCAs are computed for the ith segment for all layers and for all layer pairs to identify both interlayer and intralayer faults as described in more detail below. As WCAs for the ith segment are identified, they are added to the list $fl_i$ which is maintained in order by WCA value. Particularly for larger layouts, the fault list $fl_i$ may be limited to the top N WCAs to save memory space.

Referring back to FIG. 2, at decision block 225, it is determined whether i is greater than 1. If not, then at block 230, the overall fault list $FL_i$ for the chip is set to equal the fault list for the first segment. The method then continues at block 235 where it is determined whether i is less than the total number of segments M. If so, i is incremented at block 240 and at block 210, the boundary coordinates for the next segment are determined.

Processing for the next segment continues in the manner described above for the first segment until decision block 225. At decision block 225, once it is determined that i is greater than 1, the method proceeds at block 245 where the fault list for the segment currently being processed ($fl_i$) is merged with the overall fault list ($FL_{i-1}$) created during processing of the previous segment to create an updated version of the overall fault list ($FL_i$). Merging of fault lists is based on net equivalents at segment boundaries as described in more detail below.

Figure 5A:
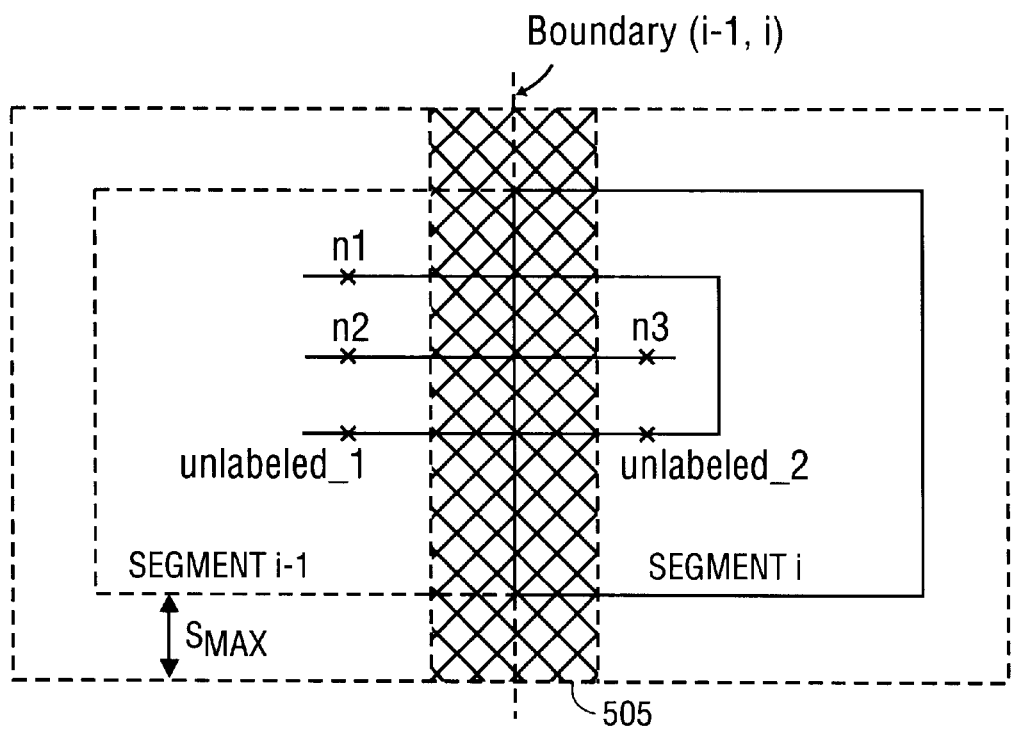
FIG. 5A is a plan view of two exemplary segments i-1 and i of a layout to be processed and a boundary region for the two segmens.
Figure 5B:
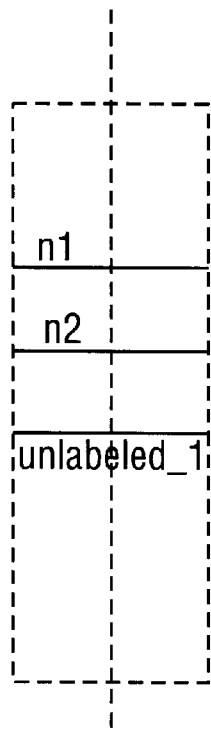
FIG. 5B is a plan view of nets in the boundary region from the perspective of the segment i-1 of FIG. 5A.
Figure 5C:
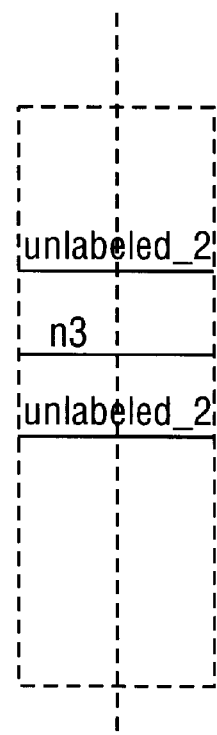
FIG. 5C is a plan view of the nets in the boundary region from the perspective of the segment i of FIG. 5A.

Referring to FIGS. 5A, 5B and 5C, the concept and utility of boundary regions is described. Because each of the segment bounding boxes is expanded by the maximum defect size $S_{max}$ for flattening, the geometric and text elements lying in an expansion region (the expanded area beyond the segment boundary) occur in two segments. An example of overlapping expansion regions, referred to herein as a boundary region, is illustrated by the cross-hatched area 505 in FIG. 5A.

As previously explained, when generating the fault list $fl_i$ for a particular segment, the geometric elements lying within the expanded bounding box of the segment are flattened and text information is propagated to all elements belonging to a net to annotate rectangles. For one embodiment, however, the text information is not propagated into the remainder of the rectangles that belong to the same net. When merging fault lists at a segment boundary, net equivalencies are extracted to address this issue.

At each segment boundary, connectivity information is generated by inspecting the annotations of rectangles lying within the corresponding boundary region from the perspective of each of the segments that contributes to the boundary region. This is done on a layer by layer basis and is repeated for all layers in the layout. Net equivalence classes are generated based on the connectivity information and used to merge fault lists.

Figure 6:
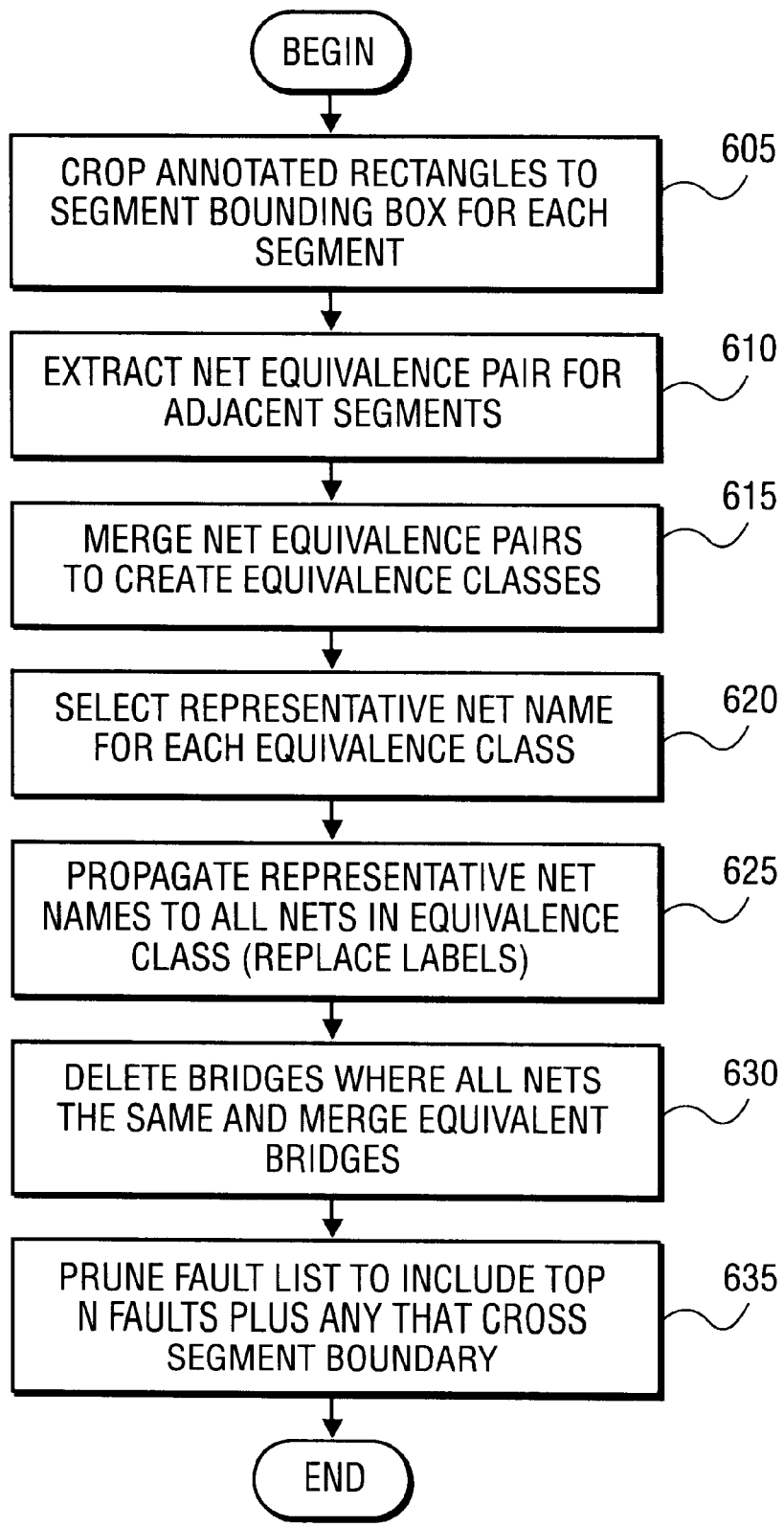
FIG. 6 is a flow diagram showing the method of one embodiment for merging fault lists.

Referring to FIG. 6 and with continuing reference to FIGS. 5A, 5B and 5C, for purposes of example, flattened layouts for segments i and i-1 are both available when processing the boundary between the two segments. (FIG. 6 illustrates aspects of the operation of the fault list stitcher 160 of FIG. 1 for one embodiment). At processing block 605, annotated rectangles that lie within the boundary region are cropped, if necessary to the bounding box of the boundary region for each of the segments i and i-1. The result of this action for the segment i-1 of FIG. 5A is shown in FIG. 5B while the cropped and annotated rectangles for the segment i are shown in FIG. 5C.

The coordinates for the rectangles shown in FIGS. 5B and 5C are the same, but the annotations indicating the net to which each rectangle belongs may be different as shown depending on which segment(s) is contributing the text label. For example, because the label n1 lies completely within segment i-1 as shown in FIG. 5A, rectangles corresponding to the net extracted from segment i-1 lying within the boundary region are annotated by n1 while those from segment i are not. Where no labels overlie a net or portion of a net in any segment being processed, the net may be annotated unlabeled_<unique number> as shown in FIG. 5A.

At processing block 610, net equivalence pairs are extracted based on corresponding net annotations in the boundary region. For example, the net equivalence pairs extracted for the flattened portion of the layout shown in FIGS. 5A, 5B and 5C are (n1, unlabeled_2), (n2, n3) and unlabeled_1, unlabeled_2).

Once net equivalence pairs are extracted at a segment boundary, they are merged at block 615 to create equivalence classes of net names. For the exemplary segments in FIG. 5A, for example, because the unlabeled_2 net name occurs in two of the above equivalence pairs, those pairs can be merged to create the equivalence class {n1, unlabeled_1, unlabeled_2}. The other equivalence class then is {n2, n3}.

After equivalence pairs are merged to create equivalence classes, a representative net name is chosen at block 620 for each equivalence class based on the best available name for the class for one embodiment. In choosing net names, names based on actual text labels in layouts are preferred to assigned, unlabeled node names. Thus, for the example shown in FIGS. 5A, 5B and 5C, n1 is chosen as the representative name for the equivalence class {n1, unlabeled_1, unlabeled_2}.

Where an equivalence class contains more than one name based on actual text labels, the name occurring at the highest level of hierarchy is chosen as the representative name for the class. Thus, for the equivalence class {n2, n3}, the representative net name depends on whether n2 or n3 is at a higher level of hierarchy in the layout.

Once a representative net name is selected for an equivalence class, the name is used to replace the label for each net in the equivalence class at block 625 when merging fault lists across a segment boundary. The process of identifying a representative net name and applying it to each net in an equivalence class is referred to herein as net name propagation. Using net name propagation, even where a layout only includes a text label on one feature of a net, accurate bridge extraction can still be provided by recognizing equivalent nets in the above-described manner. This is in contrast to some prior tools that, for example, do not address net name propagation across cell hierarchy boundaries.

Equivalence pairs are generated one layer at a time, and all layers in the layout database are processed before equivalence classes are generated. In this manner, all the net equivalencies across segment boundaries are captured in the equivalence classes used for merging the fault lists.

Once representative net names are selected for all equivalence classes, fault lists from the segment being processed and other adjacent segments that have already been processed are merged at block 630. Thus, where a layout is segmented only along one axis, the fault lists $FL_{i-1}$ and $fl_i$ at the boundary of segments i and i-1 are merged to create the fault list $FL_i$.

To merge the fault lists, the net names involved in a bridge are replaced by their representative net names where appropriate as mentioned above. In so doing, some bridges may be dropped from one or more of the fault lists while others may be merged. Bridges are dropped from a fault list when all of the nets associated with a bridge belong to the same equivalence class. Bridges are merged when they are determined to be equivalent to each other after replacing net names with representative net names for an equivalence class. For this case, the WCA values for the equivalent bridges are added together and a single bridge entry in the merged fault list is used to replace the original bridge entries. An example of such a bridge in FIG. 5A, is <n1,n2> (assuming n2 is selected as the representative net name for the equivalence class including {n2,n3}). <n1, n2> is a result of merging the bridges <n1,n2> and <n2, unlabeled_1> from segment i-1 and bridge <n3, unlabeled_2> from segment i.

While merging fault lists, the merged fault list is also pruned at block 635 for one embodiment to include only the top N bridges and any other bridges that are associated with a net that crosses a segment boundary into a segment yet to be processed. Bridges associated with net(s) crossing segment boundaries are maintained for processing of the current segment, even if they are not among the top N bridges, because the WCA value for the bridge may be updated during processing of a subsequent segment. The remaining bridges can be removed or ignored.

For one embodiment, N is a user-entered parameter. Pruning fault lists helps to lower memory requirements and ensure scalability. For other embodiments, all faults are extracted.

Referring back to FIG. 2, once fault lists have been merged, at processing block 250, all intermediate and/or unnecessary files are removed for segment i-1. Removing in this context may refer to deleting, freeing up memory space, overwriting, etc. Once all adjacent segments have been processed, the only information that needs to be maintained for the segment i-1 is the list of faults that has been merged into the overall fault list $FL_i$.

At decision block 235, if i is not less than M (i.e. all segments have been processed), then at block 255, $FL_M$ ($FL_i$ for the current segment) gives the top N bridges for the layout.

Using the above-described approach, bridge faults may be efficiently and accurately extracted even for very large layout databases without requiring an inordinate amount of memory. Further, the above-described approach provides for over-the-cell and through-the-cell routing, which may not be provided for by other fault extraction tools that use, for example, a bottom-up hierarchical fault extraction approach. Accurate analysis of layouts that include over-the-cell and/or through-the-cell routing is enabled by the segment by segment processing described above that looks at all nets in a segment.

Calculations of Weighted Critical Areas Using Two-Net Analysis

Figure 7:
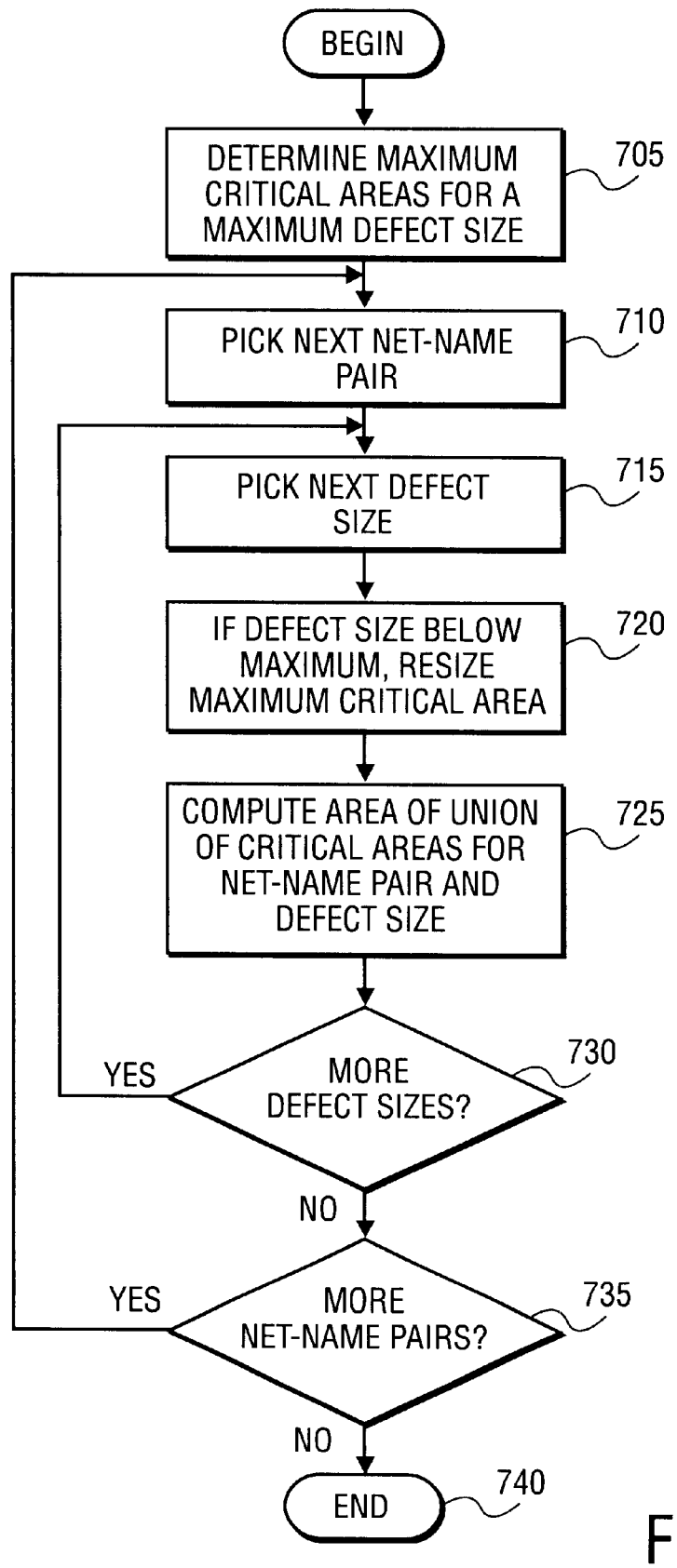
FIG. 7 is a flow diagram showing the method of one embodiment for calculating weighted critical areas in a two-net analysis mode.

FIG. 7 is a flow diagram showing one embodiment of a method for performing bridge fault extraction in a two-net analysis mode that may be used by the WCA calculator 159 of FIG. 1. Given a layout for an integrated circuit, at block 705, maximum critical areas corresponding to a maximum defect size to be evaluated are determined. One approach to determining the maximum critical areas is described in more detail below with reference to FIG. 8.

Then, as indicated by blocks 710 and 715, for each net-name pair that has one or more corresponding maximum critical areas and for each defect size to be evaluated: 1) at block 720, the maximum critical area(s) are resized to correspond to the defect size being evaluated and 2) at block 725, the area of the union of critical areas for the net-name pair and defect size is computed. Some approaches to resizing the maximum critical area(s) (block 720) and calculating the area of the union of critical areas (block 725) are described below in reference to FIGS. 8–13.

At decision block 730, if there are more defect sizes to be evaluated, the method continues at block 715. If not, then at decision block 735, if there are more net-name pairs to be evaluated, the method continues at block 710. Otherwise, the method ends at block 740.

Figure 8:
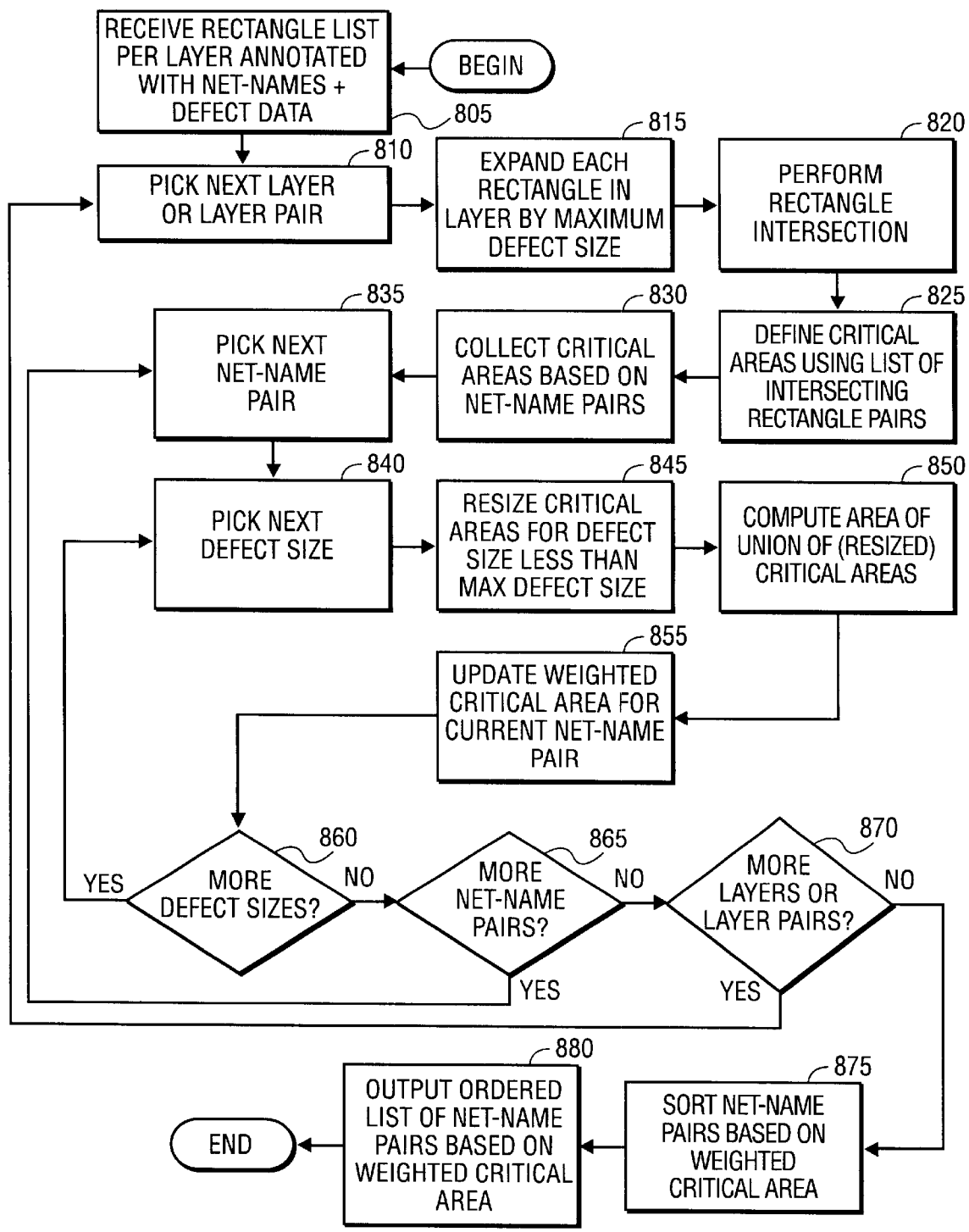
FIG. 8 is a flow diagram showing the method of another embodiment for calculating weighted critical areas in the two-net analysis mode.

FIG. 8 is a flow diagram showing another embodiment of a method for performing bridge fault extraction using a two-net analysis mode that may be used by the WCA calculator 159 of FIG. 1. At block 805, defect data that indicates defect distributions for various defect sizes and a list of rectangles annotated with corresponding net-names and rectangle corner point coordinates are received.

Typical integrated circuits include multiple layers of structures that are interconnected to form the integrated circuit. As such, it is important not only to find potential bridge faults in each layer of an integrated circuit structure, but also any faults that may cause bridges between parts of nets running on adjacent layers. For the embodiment illustrated by FIG. 8, bridge fault extraction is performed layer by layer to identify intra-layer faults and layer pair by layer pair to identify inter-layer faults.

At block 810, a next layer or layer pair to be analyzed is selected. Each rectangle in the selected layer or layer pair is then expanded at block 815 by the radius of the maximum defect size. For one embodiment, for ease of calculation, defects are approximated as being square in shape. The radius of a defect for purposes of determining critical area is therefore equal to half the length of the side of the square used to approximate the defect.

Figure 9:
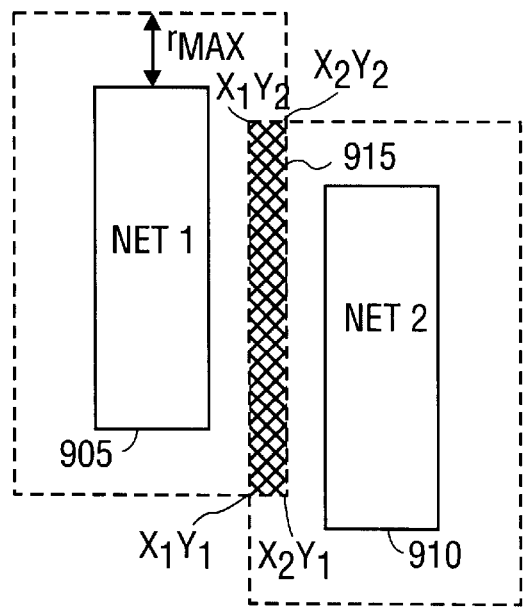
FIG. 9 is plan view of two rectangles from a layout and a corresponding maximum overlap rectangle (critical area).

FIG. 9 is a plan view of two rectangles 905 and 910 from a layout being analyzed. The rectangle 905 is part of a net referred to as NET1 in this example and the rectangle 910 is part of another net referred to as NET2. At block 810 (FIG. 8), the rectangles 905 and 910 are each expanded by the radius $r_{MAX}$ of the maximum defect size to be analyzed. The expanded rectangles are indicated by the dotted lines surrounding each of the rectangles 905 and 910.

Referring back to FIG. 8, once expanded, rectangles in the selected layer or layer pair are intersected at block 820. For one embodiment, intersections between two rectangles associated with the same net (i.e. rectangles that have the same net name) are ignored in this process.

For one embodiment, other pairs of rectangle intersection may be determined using an interval tree. An interval tree is a well-known data structure that may be used to determine overlapping intervals. A description of an interval tree is provided, for example in *Computational Geometry: An Introduction* by F. Preparata and M. I. Shamos, Springer-Verlag, 1985.

Application of the interval tree to determine rectangle intersection is described with reference to an example using the following sets of intervals: {(1,3), (5,6), (2,4), (3,6), (4,6)}. This set corresponds to a set of distinct endpoints S={1,2,3,4,5,6}. The interval tree consists of two parts: static and dynamic. In the static interval tree, there is one leaf per endpoint in the set S labeled by the endpoint itself.

Next, a balanced binary tree is built as follows. Let a be the parent of the children whose nodes are labeled by numbers $n_1$, $n_2$. then a is labeled by $(n_1+n_2)/2$. The static interval tree of this example is shown in FIGS. 20a–e.

The dynamic component is built on top of the static tree. Each interval is stored in a dynamic data structure, which can be a balanced tree and is attached to a static node. To determine where an interval (p,q) (where p<q) is inserted, a recursive search is started at the root. Where the label on the current node is r, if $p \leq r \leq q$, then the interval is inserted in the balanced tree attached to the insert operations at an X coordinate that preceeds all the interval tree delete operations at that X coordinate. In addition, for all interval tree insert operations, all intersections with the existing segments (i.e. the corresponding rectangle pairs) in the interval tree are reported.

For the example in FIGS. 20a–e, when (I, R5, 6 (1,3)) is inserted, the segments in the interval tree are (R3, (5,6)), (R4, (2,6)). Out of these two segments, the incoming segment overlaps (2,6). Therefore, the intersection of R4, R5 is reported.

This method works for enumerating overlapping rectangles in the same layer (i.e. intra-layer intersection). For reporting inter-layer intersections, it is assumed that the list of rectangles in the layer-pair J, K is given as two separate lists. Two interval trees are maintained—one for each of the layers J and K. If an interval G in the layer J is being processed, an insertion in the interval tree for layer K is faked in that the entire process of reporting the overlapping intervals is performed, but G is not inserted into the interval tree. Next, the interval G is inserted into the interval tree for layer J but no intersections are reported.

In this manner, knowledge of the overlapping horizontal and vertical segments can be used to determine pairs of rectangles that overlap. Other approaches to identifying overlapping rectangles are within the scope of various embodiments.

Each resulting intersecting rectangle pair defines a corresponding maximum overlap rectangle. For the two-net analysis mode, this maximum overlap rectangle is referred to as a maximum critical area. Such a maximum critical area is also a rectangle having an area equal to the area of the overlap of the intersecting rectangle pair. Referring to FIG. 9, for example, the maximum critical area for the rectangles 905 and 910 is indicated by the shaded area of overlap 915.

Where a single layer is being evaluated for intra-layer faults, the areas of overlap are in the same layer. Where a layer pair if being evaluated, a first rectangle in a first layer of the layer pair may overlap with a second rectangle in a second layer of the layer pair when the first layer is superimposed on the second layer. This area of overlap also identifies a maximum critical area.

Maximum critical areas are defined at block 825 from the intersecting list of rectangle pairs. The maximum critical areas are specified in terms of the X and Y coordinates of the critical area corner points in the layout of the selected layer. The X and Y coordinates of the critical area 915, for example, are <$(X_1, Y_2)$, $(X_1, Y_1)$, $(X_2, Y_1)$, $(X_2, Y_2)$>. As described above, X and Y coordinates for all four corner points or two diagonally opposite corner points may be specified and stored depending on the desired approach. Where all four corner points of the maximum critical area are specified, for one embodiment, they are specified in a counter-clockwise direction starting with the top left corner (according to X and Y coordinate values). For other embodiments, the corner points may be specified in a different order. The net-name pair with which the maximum critical area is associated (i.e. the two nets that would be bridged by the defect) is also specified for one embodiment. For the rectangles 905 and 910 of FIG. 9, for example, the net-name pair is NET1–NET 2.

For one embodiment, as each maximum critical area is identified, it is collected or bucketed at block 830 based on the net-name pair associated with the maximum critical area. This bucketing may be accomplished, for example, by collecting two diagonally opposite corner points of each critical area corresponding to each net-name pair.

The fault extraction method of one embodiment then proceeds net-name pair by net-name pair for each defect size to be analyzed. At block 835, the first net-name pair to be evaluated is selected and at block 840, the first defect size to be evaluated is selected. For one embodiment, the net-name pairs are evaluated in alphabetical or numerical order. For other embodiments, a different approach to choosing the order in which net-name pairs are evaluated may be used. Also for one embodiment, at block 840, the maximum defect size is selected first and remaining defect sizes are evaluated in descending order from the maximum defect size.

Figure 10:
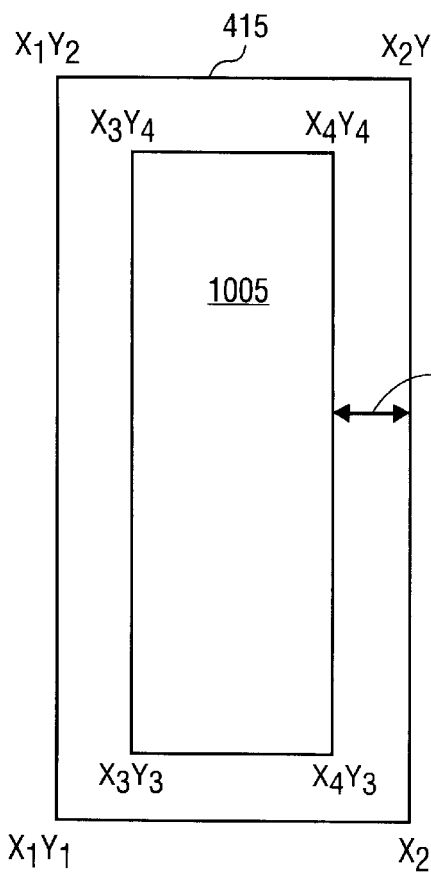
FIG. 10 is a plan view of the maximum critical area of FIG. 9 and a resized overlap rectangle (critical area) for a given defect radius.

At block 845, if the defect size being evaluated is less than the maximum defect size, then the maximum critical areas (i.e. maximum overlap rectangles) associated with the selected net-name pair are resized to correspond to the selected defect size. For one embodiment, the maximum critical areas are resized by subtracting the difference between the radius of the maximum defect size and the radius of the defect size being evaluated from all sides of the maximum critical area rectangles. For example, FIG. 10 shows the maximum critical area 915 of FIG. 9 and resized critical area 1005 for a defect radius $r_1$. As shown, the resizing operation is performed on the X and Y coordinates of the maximum critical area 915 to produce new X and Y coordinates of the resized overlap rectangle 905 (referred to as the resized critical area for the two-net analysis mode).

For one embodiment, in the two-net analysis mode, for each defect size below the maximum defect size, critical areas are resized from the maximum critical areas in the manner described above. For another embodiment, at block 845, critical areas corresponding to the current defect size being evaluated are determined by resizing the critical area corresponding to the next larger defect size. For such an embodiment, Δr in FIG. 5 is equal to the radius of the previous (i.e. next largest) defect size minus the radius of the current defect size being analyzed. For this embodiment, defect sizes are evaluated in descending order from the maximum defect size.

For some net-name pairs and defect sizes, there may be multiple corresponding critical areas that may themselves overlap. For such cases, the critical area for the net-name pair is the area of the union of all of the corresponding critical areas for the particular defect size. At block 850, this area of the union of critical areas is calculated of the net-name pair and defect size being evaluated.

One embodiment of a method that may be used at block 850 to calculate the union of critical areas for a particular net-name pair and defect size is described with reference to FIGS. 11, 12 and 13.

Figure 11:
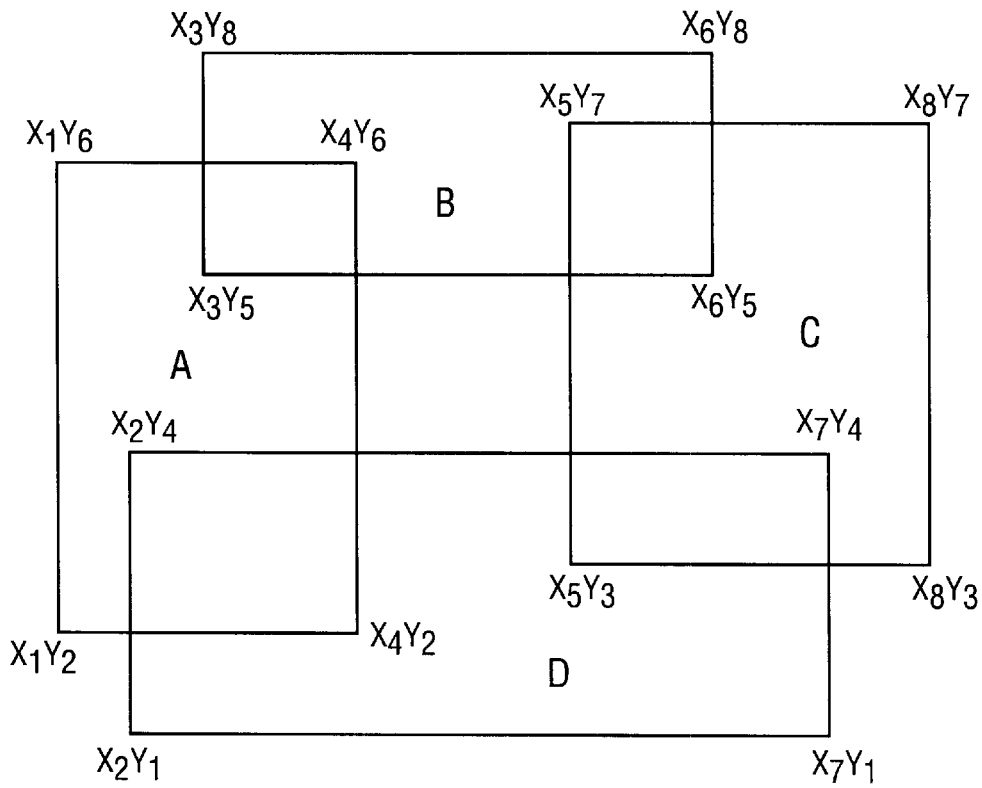
FIG. 11 is a diagram showing an example of four critical areas to be merged for a particular net-name pair in the two-net analysis mode.
Figure 12:
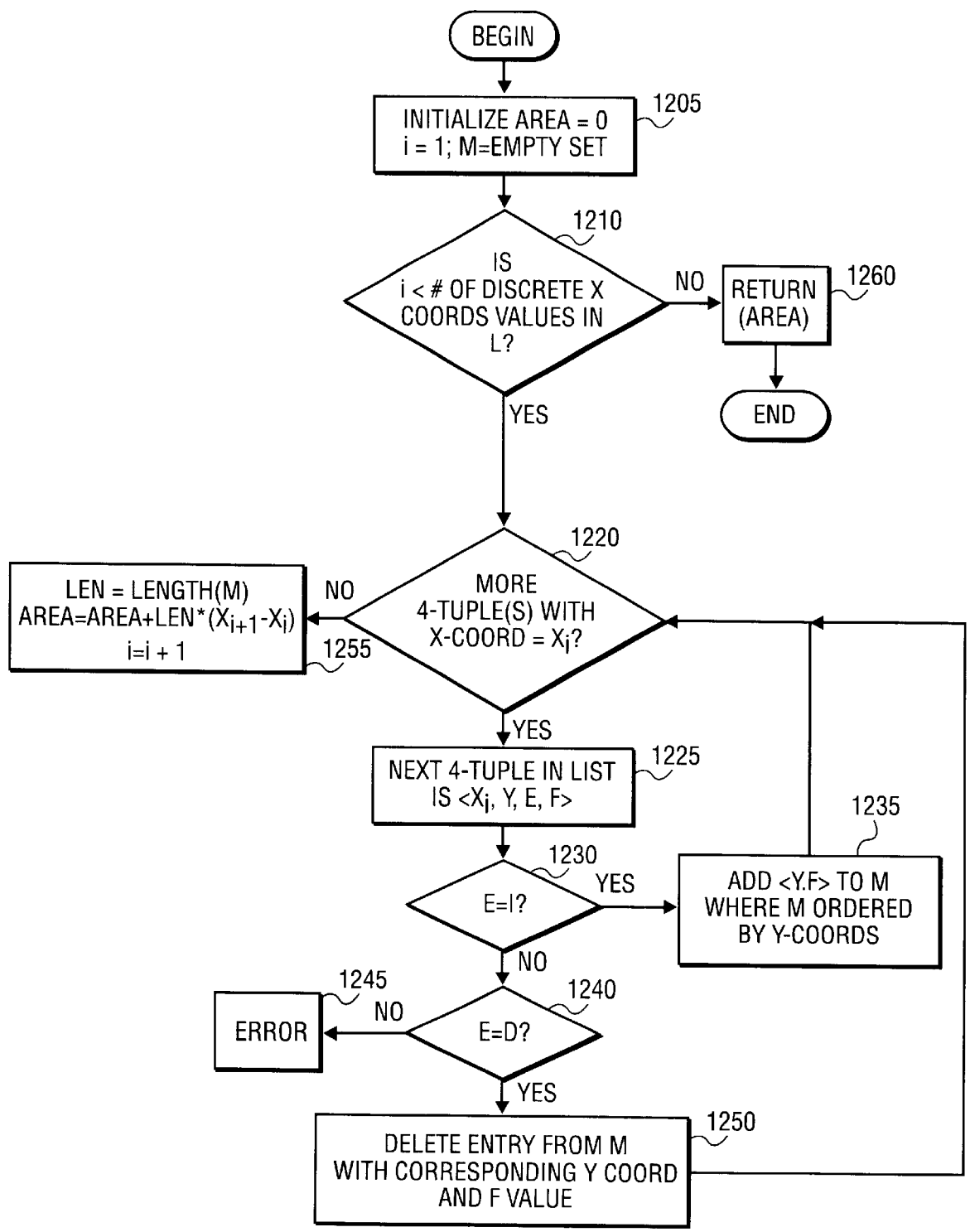
FIG. 12 is a flow diagram showing one embodiment of a method for computing an area of a union of critical areas in the two-net analysis mode.
Figure 13:
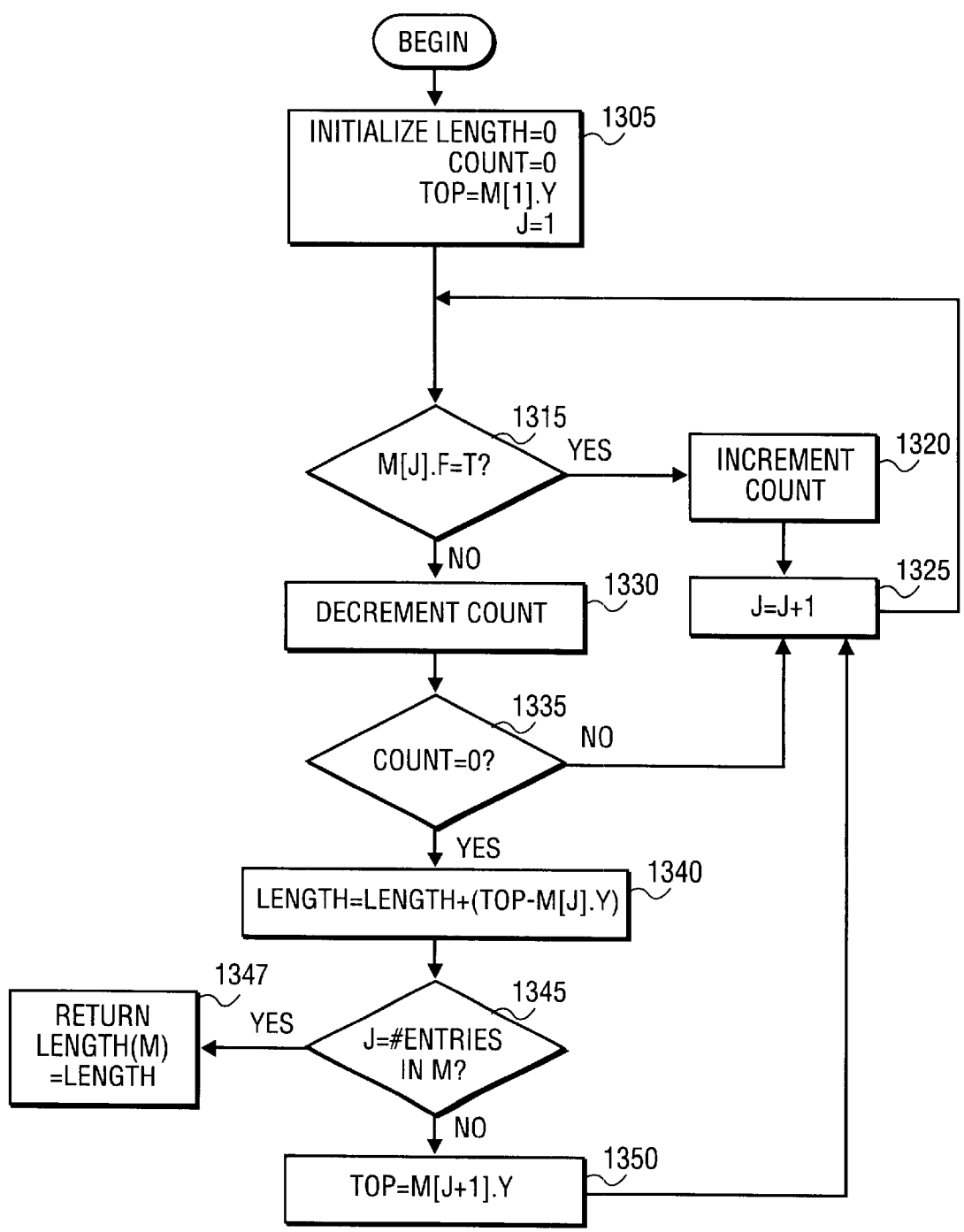
FIG. 13 is a flow diagram showing one embodiment of a method for calculating a length that may be used in the method of FIG. 12.

For purposes of illustration, exemplary overlapping critical areas A, B, C and D for a particular net-name pair (NET3–NET4, for example) and defect size are shown in FIG. 11, which is referenced in the description corresponding to FIGS. 12 and 13. The rectangles A, B, C and D each have corner points at the X and Y coordinates shown in FIG. 11. While four overlapping critical area rectangles are shown in FIG. 11, it will be appreciated that the method described in reference to FIGS. 12 and 13 may be used to merge a larger or smaller number of overlapping critical area rectangles.

For one embodiment, for maximum and resized critical areas, the corner points are specified as 4-tuples <X,Y,E,F> where X and Y are the X and Y coordinates of the corresponding corner point. For the example described below, "E" in the 4-tuple is either "I" to indicate an insert event or "D" to indicate a delete event. For this example, each corner point on the left side of the rectangle (i.e. smaller X coordinate) is indicated as an insert event and each corner point on the right side of the rectangle (i.e. larger X coordinate) is indicated as a delete event. Also in this example, "F" in the 4-tuple is either "T" to indicate the top of the rectangle (i.e. larger Y coordinate) or "B" to indicate the bottom of the rectangle (i.e. smaller Y coordinate). Other approaches to indicating an insert or delete event and/or to indicating the top or bottom of a rectangle are also within the scope of various embodiments.

As the 4-tuples described above are generated, they are inserted into an ordered list L where L is sorted in increasing order by the X coordinate value indicated in the 4-tuple. An example of such an ordered list L for the rectangles A, B, C and D of FIG. 11 is shown in FIG. 11. For one embodiment, at any given point in time, there is only one list L that corresponds to the particular net-name pair being evaluated. Once the area of the union of critical areas for that particular net-name pair has been calculated, the list L for that net-name pair may be discarded and a new list L is generated for the next net-name pair to be evaluated.

FIG. 12 is a flow diagram showing a method of one embodiment for determining the area of a union of critical areas for the two-net analysis mode. At block 1205, a variable, AREA, is initialized to zero, a variable i is set to 1 and set M is an empty set. AREA is used to indicate the area of the union of critical areas while i is used as an index to indicate the particular X coordinate being evaluated. M is a list that is extracted from the ordered list L of 4-tuples corresponding to the net-name pair being evaluated as described in more detail below.

At decision block 1210, it is determined whether the variable i is less than the number of discrete X coordinate values in the ordered list L. For the example shown in FIG. 11, there are eight discrete X coordinates $X_1$–$X_8$. If i is less than the number of discrete X coordinates in L, then at decision block 1220 it is determined whether there are more 4-tuples in L having an X coordinate equal to $X_i$. If so, then at block 1225, the next 4-tuple having an X coordinate equal to $X_i$ is evaluated. For the list L shown in FIG. 11, for example, for i=1, the first 4-tuple in L having an X coordinate equal to $X_1$ is L[1]: <$X_1$,$Y_2$,I,B>.

At decision block 1230, if the "E" variable of the 4-tuple (in the format <X,Y,E,F>) is equal to "I" or otherwise indicates an insert event as described above, the Y coordinate value and the value of the "F" variable of the 4-tuple are added to the set M at block 1235. For one embodiment, M is ordered in decreasing order by the Y coordinate value.

Referring again to the example in FIG. 11, the "E" variable of the 4-tuple L[1] is equal to "I" so <$Y_2$,B> of the 4-tuple is added to M as indicated under $X_1$. Following the same process starting at decision block 1220, <$Y_6$,T> of the 4-tuple L[2] is also added to M as shown in FIG. 11. When <$Y_6$,T> is added to M, it becomes the first entry M[1] because the value of the Y coordinate $Y_6$ is greater than the value of the Y coordinate $Y_2$ of the other entry in the list M.

It will be appreciated that, while FIG. 11 shows seven different lists M (one for each of the X coordinates $X_1$–$X_7$), for one embodiment, M is one list that is added to and subtracted from in the manner shown in FIG. 12. Each of the seven lists under the headings $X_1$–$X_7$ indicates the state of the list M after the entries in L corresponding to the indicated X coordinate have been evaluated in the manner shown in FIG. 12.

After the 4-tuple L[2] has been processed as described above, at decision block 1220, it is determined that there are no more 4-tuples in L with an X coordinate equal to $X_1$. Processing then continues at block 1255 where a partial area (indicated by the AREA variable) is calculated based on a LENGTH(M).

A method of one embodiment for determining the LENGTH(M) is illustrated in and described in reference to FIG. 13. At processing block 1305, variables LENGTH, COUNT, TOP and J are initialized as indicated. The notations M[i].Y and M[i].F as shown in FIG. 13 indicate the value of the Y coordinate and the value of the "F" variable, respectively, of the entry M[i] in the list M. In the description below, FIG. 11 is referred to as an example for purposes of illustration.

At decision block 1315, it is determined whether M[J].F is equal to T or otherwise indicates the top of a rectangle. Referring to the list M for $X_1$ in FIG. 11, for example, where J=1, M[1].F is equal to T. Thus, processing continues at block 1320 where the variable COUNT is incremented (and now equals 1 for this example). At block 1325, the variable J is incremented (and now equals 2).

The method then continues at decision block 1315 where it is determined for this example, that M[2].F does not equal T or otherwise indicate the top of a rectangle. Processing continues at block 1330 where COUNT is decremented (and now equals 0 for this example). Then, at decision block 1335, it is determined that COUNT equals 0 so at block 1340, the variable LENGTH is updated as indicated. For this example, the TOP variable is initialized to M[1].Y=$Y_6$ at block 1305, thus, at block 1340 LENGTH=0+($Y_6$–$Y_2$)=$Y_6$–$Y_2$. At decision block 1345, it is determined whether J is equal to the number of entries in the list M. For this example, J=2 and the list M for $X_1$ includes 2 entries so at block 1347, LENGTH(M), which equals LENGTH=$Y_6$-$Y_2$ for this example, is returned.

Referring back to FIG. 12, once LENGTH(M) is returned, a partial area is calculated as shown at block 1255. For the above example, the partial area indicated by the AREA variable is now equal to 0+($Y_6$-$Y_2$)*($X_2$-$X_1$) or simply ($Y_6$-$Y_2$)*($X_2$-$X_1$). Also at block 1255, the variable i is incremented and processing continues for the next discrete X coordinate ($X_2$ in this example) at decision block 1210 as described above.

Because the "E" variable of each entry in L for $X_2$ also indicates an insert event, the corresponding Y coordinates and "F" variable values are added to M in the manner described above. Thus, after evaluating the entries in L for $X_2$, the list M is as shown in FIG. 11 under $X_2$. The LENGTH(M) is calculated for the list M for $X_2$ and the value of the AREA variable is updated in the manner described above for $X_1$. The value of the AREA variable at this point, for example, is updated to equal [($Y_6$-$Y_2$)*($X_2$-$X_1$)]+[($Y_6$-$Y_1$)*($X_3$-$X_2$)]. Processing for $X_3$ and subsequent updating of the AREA variable also proceeds in a similar manner.

For i=4, and thus, X=$X_4$, however, there are some differences. Referring back to decision block 1230 in FIG. 12, if the "E" variable of the 4-tuple being evaluated does not indicate an insert event, then at decision block 1240, it is determined whether the "E" variable equals D or otherwise indicates a delete event. If not, an error is indicated at block 1245. Otherwise, processing proceeds at block 1250 where an entry in the list M having a corresponding Y coordinate and "F" variable value is deleted from M.

Referring again to FIG. 11 for purposes of illustration, for $X_4$, for example, the value of the "E" variable of the first 4-tuple in L having the X coordinate $X_4$ (L[7]) equals D. The list M, before processing of 4-tuples having an X coordinate equal to $X_4$, includes the entries shown under $X_3$. Thus, at processing block 1250, an entry in M having a Y coordinate equal to $Y_2$ and an "F" variable value equal to B (M[5]) is deleted from M. The only other 4-tuple in L having an X coordinate equal to $X_4$, L[8], also indicates a delete event and thus, at processing block 1250, the entry M[2] having a Y coordinate equal to $Y_6$ and an "F" variable value equal to T is also deleted from the list M. In this manner, after processing the 4-tuples in L having an X coordinate to $X_4$, the list M includes the entries under $X_4$ in FIG. 11.

As described above, LENGTH(M) is then calculated for the list M for $X_4$ using the approach shown in FIG. 13 for one embodiment. Referring again to FIG. 13, variables are initialized as described above at block 1305. At decision block 1315, M[1].F=T so COUNT is incremented to equal 1 at block 1320 and J is incremented to equal 2 at block 1325. At decision block 1315, M[2].F does not equal T or otherwise indicate the top of a rectangle so at block 1330, COUNT is decremented and equals 0.

Processing then proceeds at block 1340 where LENGTH is updated as indicated to equal 0+(M[1].Y−M[2].Y)=$Y_8$-$Y_5$ for this example. Then, at decision block 1345, where J=2, it is determined that J does not equal the current number of entries in M, which, for this example, is 4. Thus, at processing block 1350, the variable TOP is updated to equal M[J+1].Y=M[3].Y=$Y_4$ as indicated in FIG. 13. J is then incremented at block 1325 and processing continues at decision block 1315.

Continuing with this example, at block 1315, M[3].F equals T so COUNT is incremented at block 1320 and equals 1. J is incremented at block 1325 and is equal to 4. Then, at decision block 1315, it is determined that M[4].F does not equal T and COUNT is decremented at block 1330 and is equal to 0. At block 1340, LENGTH is updated to equal the previous length plus the current length or ($Y_8$-$Y_5$)+(TOP($Y_4$)-M[4].Y) which equals ($Y_8$-$Y_5$)+($Y_4$-$Y_1$) for this example.

By determining the effective length for the partial area calculation of FIG. 12 in this manner, the method shown in FIG. 13 takes into account the fact that there is an empty space in the middle of the rectangles A, B, C, and D. Using this approach, the area of the empty space is excluded from the area calculation of the union of critical areas such that accuracy of this calculation is not compromised.

With continuing reference to FIG. 13, at decision block 1345, it is determined that J (currently equal to 4) is equal to the current number of entries in M and LENGTH is returned as LENGTH(M) at block 1347. Referring back to FIG. 12, the AREA variable is then appropriately updated to add the next partial area as indicated at block 1255 and i is again incremented.

Processing proceeds in the above described manner to add partial areas to the overall area calculation until, at decision block 1210, it is determined that the value of the variable i is not less than the number of discrete X coordinates values in L. Then, at block 1260, the current value of the variable AREA, which is now equal to the area of the union of critical areas being evaluated, is returned. Thus, for the example shown in FIG. 11, once i=8, the value of AREA is returned at block 1260.

Referring back to FIG. 8, once the area of the union of critical areas for the selected net-name pair and defect size has been calculated as described above, at block 855, the corresponding weighted critical area is calculated. This weighted critical area is then added to a list of weighted critical areas for the selected net-name pair. The weighted critical area for a net-name pair and defect size is equal to the area of the union of critical areas associated with the net-name pair times the probability of the occurrence of a defect of the given size. This probability information is provided as part of the defect data received at block 805 as mentioned above.

At decision block 860, if there are more defect sizes to be evaluated, the method continues at block 840 where the next defect size is selected to be evaluated as described above. If not, then at decision block 865, it is determined whether there are more net-name pairs to be evaluated for the selected layer or layer pair. If so, then the method continues at block 835 where the next net-name pair is selected and evaluated as described above.

If all defect sizes for all net-name pairs for the selected layer or layer pair have been processed, then at decision block 870, it is determined whether there are more layers and/or layer-pairs to evaluate. If so, the method continues at block 810 where the next layer or layer pair is selected and analyzed as described above.

When all layers and layer pairs have been analyzed, at block 875, net-name pairs are sorted by weighted critical area and provided in block 880 as an ordered list. The list may be ordered in decreasing order of clinical area, for example.

WCA Calculation Using Multi-Net Analysis

Figure 14:
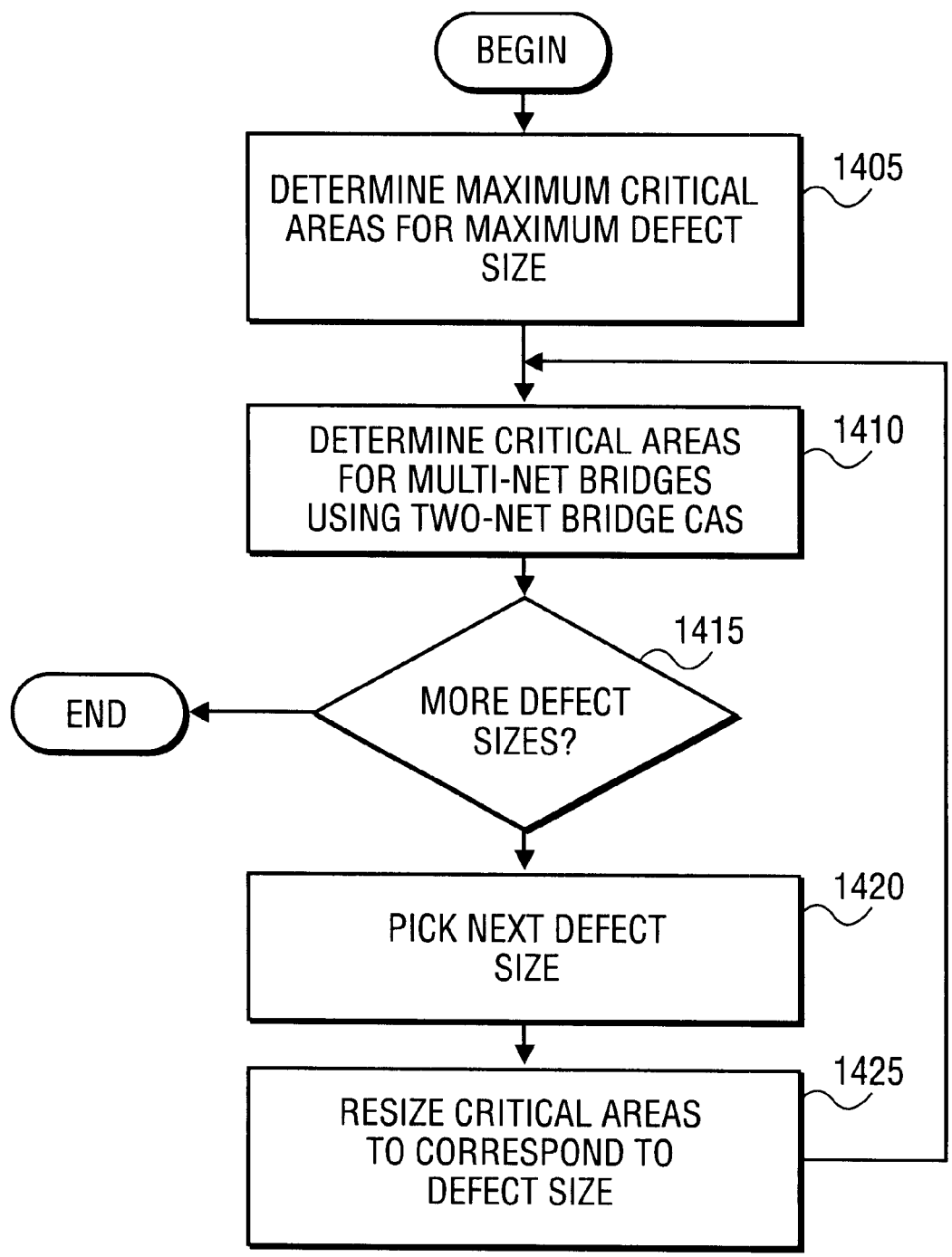
FIG. 14 is a flow diagram showing a method of one embodiment for calculating weighted critical areas for bridges in a multi-net analysis mode.

While the above-described approaches relate to a two-net analysis mode, in some circumstances it may also be desirable to identify WCAs of multi-net bridges. FIG. 14 is a flow diagram showing an embodiment of a method for performing bridge fault extraction in a multi-net analysis mode that may be used by the WCA calculator 159 of FIG. 1. Given a layout for an integrated circuit, at block 1405, overlap rectangles corresponding to a defect size to be evaluated are determined. The overlap rectangles identified at block 1405 correspond to two nets (i.e. net-name pairs) and may be identified in the manner described above with reference to FIG. 8. It is noted that these overlap rectangles are not referred to as or considered to be critical areas for the multi-net analysis mode.

Then, as indicated by block 1410, critical areas for two-net and multi-net bridges are determined using the overlap rectangles determined for net-name pairs at block 1405. At decision block 1415, it is determined whether there are more defect sizes to be analyzed. If so, then at block 1420, the next defect size is selected. At block 1425, the previously identified two-net overlap rectangles are resized to correspond to the defect size being evaluated. The method then continues at block 1410 until two-net and/or multi-net critical areas have been determined for all defect sizes to be analyzed using the overlap rectangles determined for net-name pairs.

Figure 15:
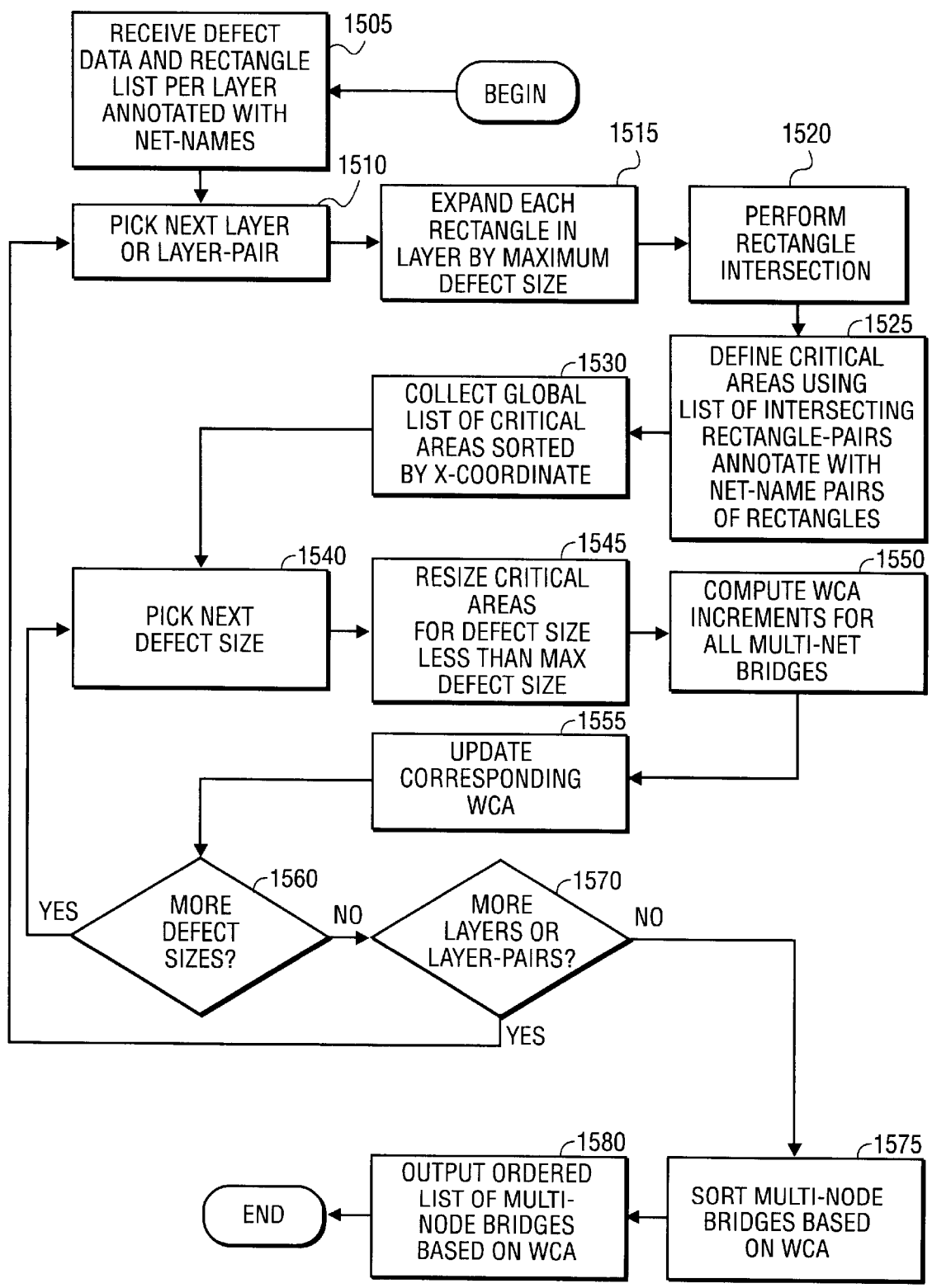
FIG. 15 is a flow diagram showing a method of another embodiment for calculating weighted critical areas for bridges in the multi-net analysis mode.

FIG. 15 is a flow diagram showing yet another embodiment of a method for performing bridge fault extraction in a multi-net analysis mode that may be used by the WCA calculator 159 of FIG. 1. At block 1505, defect data that indicates defect distributions for various defect sizes and a list of rectangles annotated with corresponding net-names and rectangle corner point coordinates are received.

At block 1510, a next layer or layer pair to be analyzed is selected. Each rectangle in the selected layer or layer pair is then expanded at block 1515 by the radius of the maximum defect size and intersected at block 1520 as described above to identify maximum overlap rectangles which are defined at block 1525.

At block 1530, a global list L of net-name pair overlap rectangles is developed as the overlap rectangles are defined at block 1525. The global list is provided, for one embodiment, in the form of 6-tuples including one 6-tuple <X,Y,E,F,m,n> for each corner point of each overlap rectangle. As for the 4-tuples described above, X and Y are the X and Y coordinates of the corresponding corner point, "E" is either "I" to indicate an insert event or "D" to indicate a delete event and "F" is either "T" to indicate the top of the rectangle or "B" to indicate the bottom of the rectangle. The last two entries, m and n, in the 6-tuple indicate the net-name pair with which the corresponding overlap rectangle is associated.

As the 6-tuples are generated, they are ordered in the list L by increasing order of X coordinate value. An example of such an ordered list L for overlap rectangles 1601–1605 of FIG. 6 is shown in FIG. 16. The letters in the brackets (e.g. <M,N> for the overlap rectangle 1102) indicate the particular net-name pair to which the overlap rectangle corresponds.

The fault extraction method of one embodiment then proceeds at block 1540 where the first defect size to be evaluated is selected. For one embodiment, at block 1540, the maximum defect size is selected first and remaining defect sizes are evaluated in descending order from the maximum defect size.

At block 1545, if the defect size being evaluated is less than the maximum defect size, then the overlap rectangles associated with the selected net-name pair are resized to correspond to the selected defect size as described above. For one embodiment, a new ordered list L of 6-tuples is created for each defect size below the maximum defect size as the overlap rectangles are resized at block 1545. The previous list L may be overwritten once an ordered list of WCAs for that particular defect size has been developed as explained below and/or once a new list L for the next defect size has been developed.

At block 1550, critical areas for two-net and multi-net bridges are computed in increments. One embodiment of a method that may be used at block 1550 to calculate critical areas for a particular defect size is described with reference to FIGS. 16, 17, 18 and 19.

Figure 18:
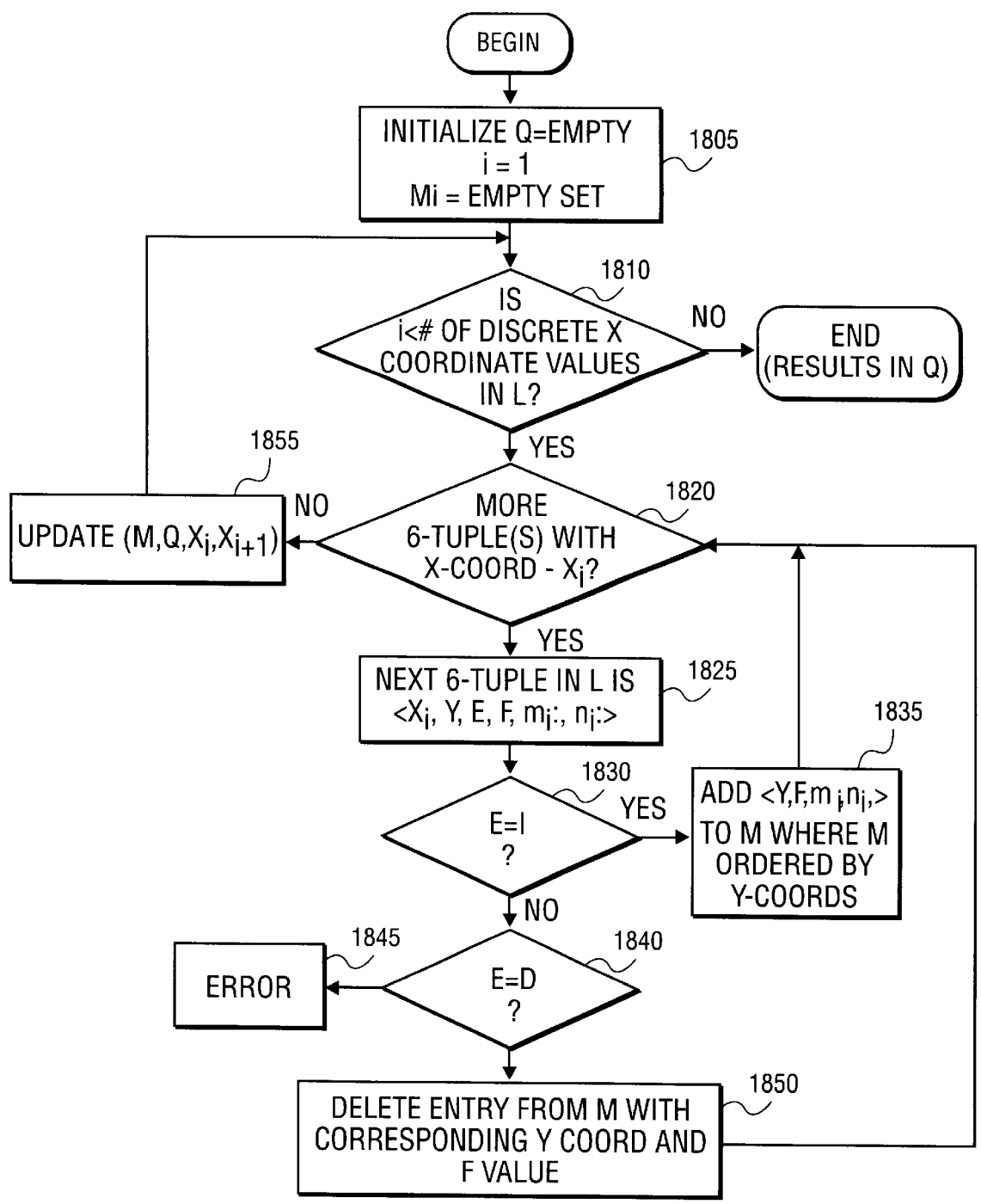
FIG. 18 is a flow diagram showing one embodiment of a method for computing critical areas in the multi-net analysis mode for a given defect size.
Figure 19:
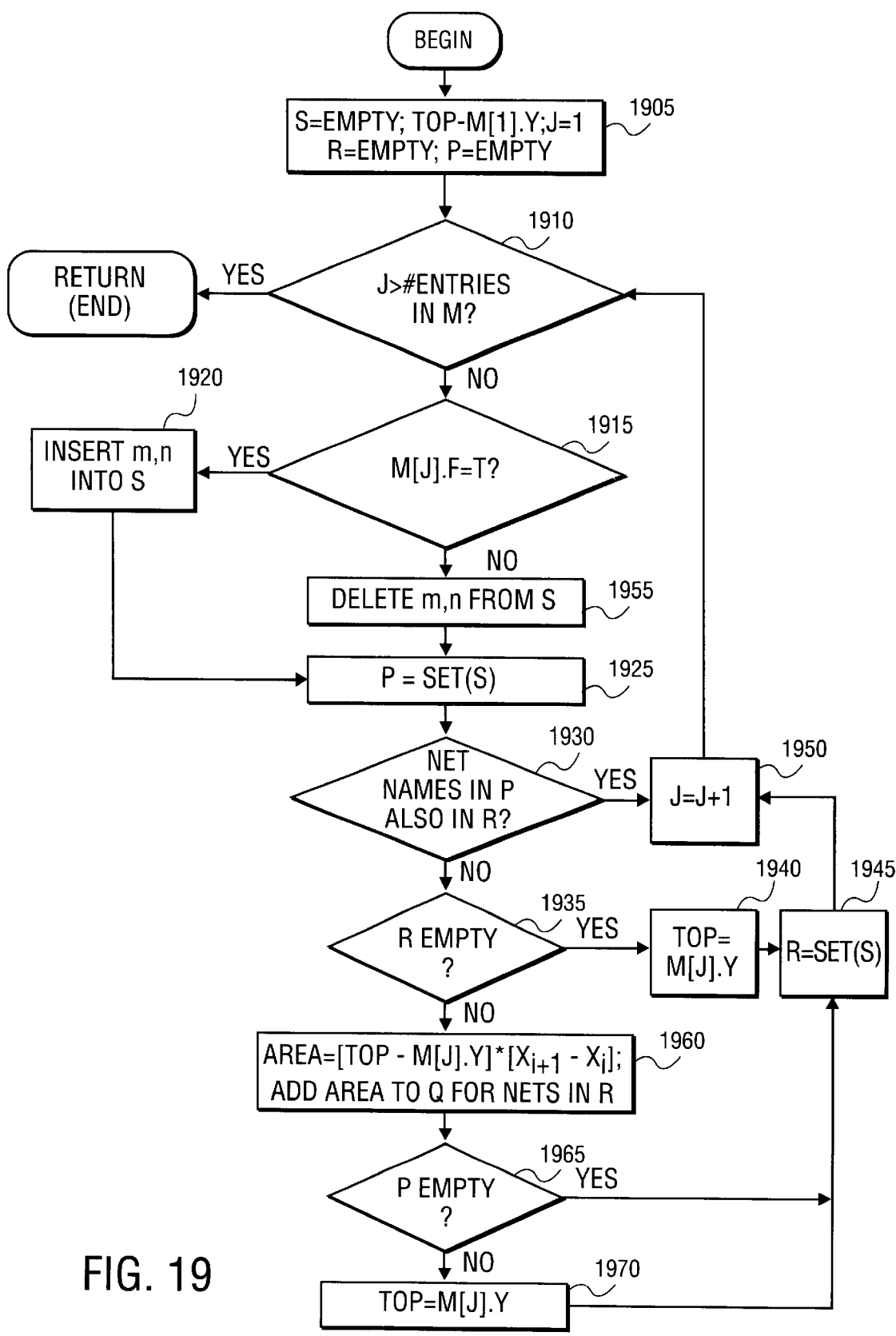
FIG. 19 is a flow diagram showing one embodiment of a method for updating a global list of bridges that may be used in the method of FIG. 18.
Figure 20A:
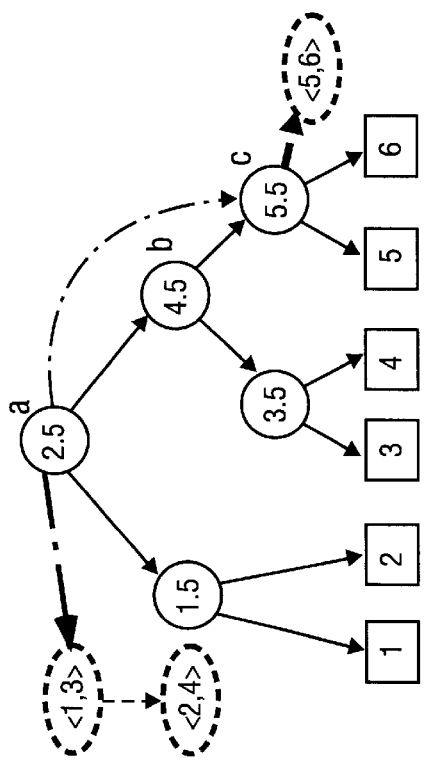
FIGS. 20a–d are diagrams showing a rectangle intersection approach of one embodiment.
Figure 20B:
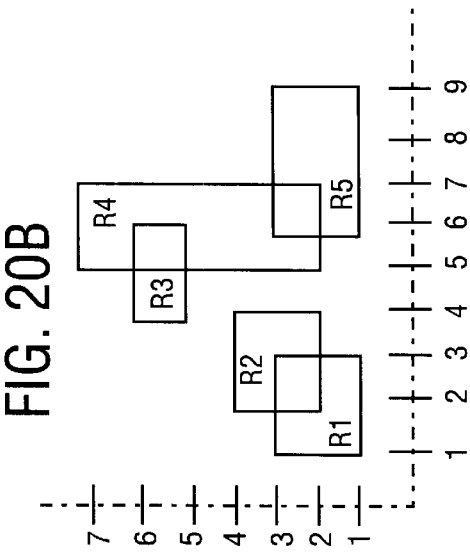
Figure 20C:
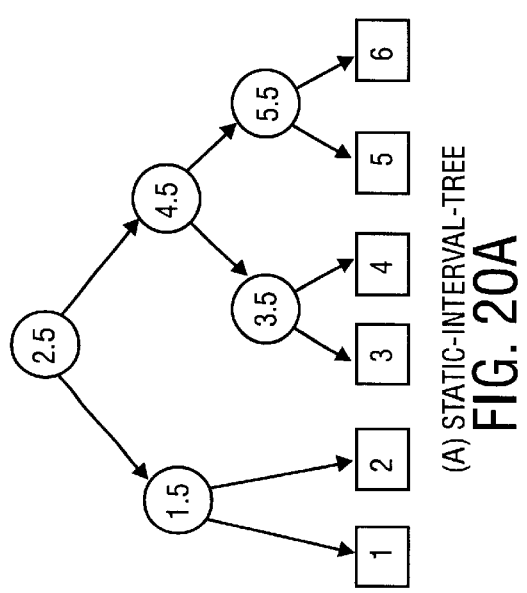
Figure 20D:
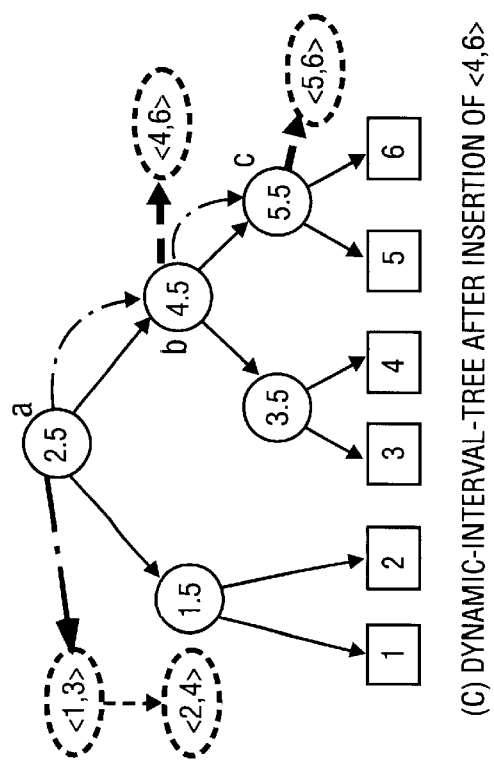

For purposes of illustration, exemplary overlapping overlap rectangles 1601–1605 for a particular defect size are shown in FIG. 16, which is referenced in the description corresponding to FIGS. 18 and 19. The rectangles 1601–1605 each have corner points at the X and Y coordinates shown in FIG. 16. While five overlap rectangles are shown in FIG. 16, it will be appreciated that the method described in reference to FIGS. 18 and 19 may be used to determine critical areas for a larger or smaller number of overlap rectangles.

FIG. 18 is a flow diagram showing a method of one embodiment for determining critical areas corresponding to two-net and multi-net bridges using a multi-net analysis mode. At block 1805, a list Q is initialized to be empty, a variable i is set to 1 and set M is an empty set. The list Q is a global list of two-net and/or multi-net bridges for which the critical area (or weighted critical area) is greater than 0 while the variable i is used as an index to indicate the particular X coordinate being evaluated. M is a list ordered by Y-coordinate value that is extracted from the ordered list L of 6-tuples. M indicates information regarding the active horizontal line segment(s) for particular X coordinate(s) as described in more detail below.

At decision block 1810, it is determined whether the variable i is less than the number of discrete X coordinate values in the ordered list L. For the example shown in FIG. 16, there are nine discrete X coordinates $X_1$–$X_9$. If i is less than the number of discrete X coordinates in L, then at decision block 1820 it is determined whether there are more 6-tuples in L having an X coordinate equal to $X_i$. If so, then at block 1825, the next 6-tuple having an X coordinate equal to $X_i$ is evaluated. For the list L shown in FIG. 16, for example, for i=1, less than the number of discrete X coordinates in L, then at decision block 1820 it is determined whether there are more 6-tuples in L having an X coordinate equal to $X_i$. If so, then at block 1825, the next 6-tuple having an X coordinate equal to $X_i$ is evaluated. For the list L shown in FIG. 16, for example, for i=1, the first 6-tuple in L having an X coordinate equal to $X_1$, is L[1]: <$X_1$, $Y_3$,I,B,M,N>.

At decision block 1830, if the "E" variable of the 6-tuple is equal to "I" otherwise indicates an insert event, the Y coordinate value, the value of the "F" variable and the net-name pair of the 6-tuple are added to the set M at block 1835. For one embodiment, M is sorted in decreasing order by the Y coordinate value.

Referring again to the example in FIG. 16, the "E" variable of the 6-tuple L[1] is equal to "I" so <$Y_2$,B,M,N> of the 6-tuple is added to M as indicated under $X_1$. Following the same process starting at decision block 1820, <$Y_7$, T,M,N> of the 6-tuple L[2] is also added to M as shown in FIG. 16. When <$Y_7$,T,M,N> is added to M, it becomes the first entry M[1] because the value of the Y coordinate $Y_7$ is greater than the value of the Y coordinate $Y_3$ of the other entry in the list M.

It will be appreciated that, while FIG. 16 shows eight different lists M (one for each of the X coordinates $X_1$–$X_8$), for one embodiment, M is one list that is added to and subtracted from in the manner shown in FIG. 18. Each of the eight lists under the headings $X_1$–$X_8$ indicates the state of the list M after the entries in L corresponding to the indicated X coordinate have been evaluated in the manner shown in FIG. 18.

After the 6-tuple L[2] has been processed as described above, at decision block 1820, it is determined that there are no more 6-tuples in L with an X coordinate equal to $X_1$. Then, at block 1855, an update process is performed to determine incremental two-net and/or multi-net critical areas.

A method of one embodiment for determining the incremental, two-net and/or multi-net critical areas at block 1855 is illustrated in and described in reference to FIG. 19. At processing block 1905, sets S, R and P and variables TOP and J are initialized as indicated. S is a list of net names (possibly with duplication), P is the current set of net names and R is the previous set of net names. As above, the notations M[i].Y and M[i].F indicate the value of the Y coordinate and the value of the "F" variable, respectively, of the entry M[i] in the list M.

At decision block 1910, it is determined whether J is greater than the number of entries in M (number of entries in M is 2 for i=1 as shown in FIG. 16). If not, then at decision block 1915, it is determined whether M[J].F is equal to T or otherwise indicates the top of a rectangle. Referring to the list M for $X_1$ in FIG. 16, for example, where J=1, M[1].F is equal to T. Thus, processing continues at block 1920, where the net names indicated by the variables m and n in the 6-tuple (in the format <X,Y,E,F,m,n>) are added to the set S. For the current example, S then includes M and N as shown in FIG. 17. At block 1925, the set P is assigned the values of the set S and at decision block 1930, it is determined whether P and R include the same net-names. If they do not include the same net-names, then at decision block 1935, it is determined whether R is empty.

For the current example, S, and therefore, P includes M and N while R is still empty. Thus, processing proceeds at block 1940 where TOP is assigned the value of M[J].Y, which, in this example, is $Y_7$. At block 1945, R is set to be equal to S and at block 1950, J is incremented.

The method then continues at decision block 1910 where is determined, for this example that J (now 2) is still not greater than the current number of entries in M. At block 1915, it is determined, for this example, that M[2].F equals B (or otherwise indicates the bottom of a rectangle). Processing therefore continues at block 1955, where corresponding net names are deleted from S as shown in FIG. 17. At block 1925, is set to equal S and at decision block 1930, it is determined that the net names in P are not the same as the net names in R. In this case, P is empty while R includes M and N. Thus, processing proceeds at block 1960 where an incremental area is calculated. At block 1960, AREA= [TOP−M[J].Y]*[$X_{i+1}$−$X_i$]. For this example, AREA=[$Y_7$−$Y_3$]*[$X_2$−$X_1$]. This area is added to the list Q for the nets in R. Thus, for this example, Q includes an entry for the net pair M,N with the AREA provided above. Because P is now empty (block 1965), processing proceeds at block 1945 where R=SET(S) and at block 1950 where J is incremented. At block 1910, it is determined that J is now greater than the current number of entries in M and processing returns to decision block 1855 in FIG. 18 where i is incremented.

For $X_2$, processing proceeds in a similar manner to adjust the list M in the manner shown in FIG. 16 under $X_2$. At block 1855, incremental areas are again calculated in the manner described above. Variables are initialized at block 1905 and at block 1910, it is determined that J is not greater than the number of entries in M. At block 1915, M[1].F equals T so M and N are inserted into S as shown in FIG. 17.

It will be noted in FIG. 17 that for J=2, M and N are again added to S such that there are duplicate entries for M and N in S. At decision block 1930. however, even though P includes two entries for M and N and R only includes one entry for M and N, they both include the same net names. Thus, processing proceeds at block 1950.

The incremental critical area for M and N is calculated at block 1960 when J=4. The AREA is determined to be [$Y_7$−$Y_1$]*[$X_3$−$X_2$]. This area is added to the critical area for the net-names in R which are M and N for this example. Thus, the list Q is updated to add the new area increment for M and N to the previous area increment calculated for M and N. Processing then returns again to FIG. 18, where i is again incremented.

For $X_3$, processing proceeds in a similar manner to adjust the list M as shown in FIG. 17 under $X_3$. The process of FIG. 19 is performed as described above such that the sets S, R and P are as shown in FIG. 17 at each of the different values for J. At decision block 1930, when J=2, for example, it is determined that P and R do not include the same net-names and at decision block 1935, it is determined that R is not empty. Thus, at block 1960, an area calculation is performed as described above and the incremental critical area is added to the critical area for the particular net-names in R (in this case, M and N again).

When the AREA calculation is finished, however, it is determined at processing block 1965 that P is not empty. Thus, at block 1970, TOP is updated to equal M[J].Y—in this case, M[2].Y=$Y_5$. Processing continues at block 1945 where R gets the values in S and at block 1950, J is incremented.

Since, at block 1910, J is still less than the number of entries in M (J=3 and M includes 6 entries at $X_3$), processing continues as described above such that S, P and R are added to and subtracted from in the manner shown in FIG. 17. For J=5, as shown in FIG. 17, it is determined at block 1930, that the net-names in P are not the same as the net-names in R and at block 1935, that R is not empty. Thus, at block 1960, another incremental critical area is calculated in a similar manner. This time, however, the incremental critical area is associated with a multi-net bridge as shown by the entries in R: M, N and P. Thus, an entry is added to Q for M, N and P along with the incremental critical area calculated at block 1960. For $X_3$, it will be noted that another incremental critical area for the nets M and N is calculated for J=6.

Processing continues in the above-described manner for each discrete X coordinate associated with an identified overlap rectangle with the exception of the rightmost X coordinate. As shown in FIG. 18, once i is incremented to equal the number of discrete X coordinates in L, the process ends.

It should be noted that the method for calculating incremental critical areas illustrated in FIGS. 18 and 19 and described above also takes into account empty spaces between overlap rectangles such that they are subtracted from the critical area calculations. This can be seen when performing the methods of FIGS. 18 and 19 for $X_5$, for example.

Referring back to FIG. 15, once incremental critical areas have been calculated at block 1550 in the above manner for all overlap rectangles defined in blocks 1525 and 1530, then at block 1555, corresponding weighted critical areas are updated using defect data corresponding to the particular defect size being evaluated.

At decision block 1560, if there are more defect sizes to be evaluated, than at block 1540, the next defect size is selected and processing proceeds as described above. At block 1560, if all defect sizes have been evaluated, then at block 1570, it is determined whether there are more layers or layer-pairs to be analyzed. If so, processing proceeds at block 1510 as described above. If not, then at block 1575, two-net and/or multi-net bridges are sorted by weighted critical area and at block 1580, a list of two-net and/or multi-net bridges ordered by WCA is provided as output data.

The ordered lists provided by the above approaches may be used to target and prioritize manufacturing tests to achieve a desired balance of test coverage versus test time, for example. Such a capability may be particularly important as some companies begin to move from functional testing towards structural testing.

Using the above-described approaches, processor execution time may be reduced as compared to prior fault extraction programs by calculating maximum overlap rectangles (or critical areas) first and determining overlap rectangles (or critical areas) for smaller defect sizes by reducing the maximum overlap rectangles (critical areas) in the manner described above. Further, local merging of critical areas in a two-net analysis mode may also improve efficiency by bucketing all critical areas associated with a net-name pair together such that overlapping critical areas can be easily identified and processed.

Due to this improved efficiency, it may be possible in some cases to perform bridge fault extraction for a larger number of defect sizes in a smaller amount of time. By using a larger number of defect sizes, the list of weighted critical areas provided by the WCA calculator 159, for example, may more closely approximate a continuous distribution of defect sizes and therefore, may be more accurate. This improved efficiency may also provide the capability to analyze larger layouts in a shorter amount of time.

These improvements in efficiency (particularly where there are fewer calculations) may also help in terms of the storage space needed on a server to perform the likely bridge fault extraction. Thus, it may be possible in some cases to analyze a larger integrated circuit layout without running out of space on the host computer system as compared to prior bridge fault extraction approaches.

Additionally, by using the above-described approach of calculating overlap rectangles (critical areas) for smaller defect sizes from the maximum overlap rectangles (critical areas) and then calculating the area of a union of critical areas based on the resized critical areas for the two-net analysis mode, embodiments of the invention strike a balance between performance and accuracy concerns. For the multi-net analysis mode, by determining the critical areas associated with multiple nets, accuracy may be further improved.

In the foregoing specification, the invention has been described with reference to specific exemplary embodiments thereof. It will, however, be appreciated that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
    flattening one of a plurality of segments of a hierarchically described integrated circuit layout to produce an annotated list of rectangles;
    computing an intermediate fault list corresponding to the segment using the annotated list of rectangles;
    merging the intermediate fault list with any prior-generated fault list to produce an intermediate merged fault list; and
    repeating the actions of flattening, computing and merging for each of the plurality of segments to produce a merged fault list.

2. The method of claim 1 wherein, for each of the plurality of segments, the actions of flattening, computing and merging are repeated for each layer and each layer-pair of the integrated circuit layout before flattening a next segment.

3. The method of claim 1 wherein merging the intermediate fault list with any prior-generated fault list includes limiting the intermediate merged fault list to the top N faults and any faults that cross the segment boundary.

4. The method of claim 3 further comprising
    limiting the merged fault list to the top N faults.

5. The method of claim 1 further comprising
    deleting the flattened layout and intermediate fault list corresponding to a first segment after the intermediate fault list for the first segment is merged with the intermediate fault lists for all adjacent segments.

6. The method of claim 1 further comprising:
    determining boundary coordinates of a segment bounding box for the one of the plurality of segments to be flattened,
    wherein flattening the one of the plurality of segments includes expanding the segment bounding box by a radius of a maximum defect size to be evaluated.

7. The method of claim 6 further comprising:
    propagating net names across segment boundaries.

8. The method of claim 7 wherein propagating net names includes
    extracting net equivalence pairs for the one of the plurality of segments and an adjacent segment;
    merging net equivalence pairs to create one or more net equivalence classes;
    identifying a representative net name for each net equivalence class; and
    propagating the representative net name for each net equivalence class to all nets in the net equivalence class.

9. The method of claim 8 further comprising
    identifying potential faults in the flattened segment by weighted critical area, each potential fault having at least two associated net names; and
    after propagating the representative net name, deleting potential faults where all associated net names are the same.

10. An apparatus comprising:
    a machine-accessible medium including instructions that, when executed by a machine, cause the machine to perform a method comprising:
    flattening one of a plurality of segments of a hierarchically described integrated circuit layout to produce an annotated list of rectangles;
    computing an intermediate fault list corresponding to the segment using the annotated list of rectangles;
    merging the intermediate fault list with any prior-generated fault list to produce an intermediate merged fault list; and
    repeating the actions of flattening, computing and merging for each of the plurality of segments to produce a merged fault list.

11. The apparatus of claim 10 wherein, for each of the plurality of segments, the actions of flattening, computing and merging are repeated for each layer and each layer-pair of the integrated circuit layout before flattening a next segment.

12. The apparatus of claim 10 wherein merging the intermediate fault list with any prior-generated fault list includes limiting the intermediate merged fault list to the top N faults and any faults that cross the segment boundary.

13. The apparatus of claim 10 wherein the machine-accessible medium further includes instructions, that when executed by a machine, cause the machine to perform a method further comprising deleting the flattened layout and intermediate fault list corresponding to a first segment after the intermediate fault list for the first segment is merged with the intermediate fault lists for all adjacent segments.

14. The apparatus of claim 10 wherein the machine-accessible medium further includes instructions, that when executed by a machine, cause the machine to perform a method further comprising:

determining boundary coordinates of a segment bounding box for the one of the plurality of segments to be flattened, wherein flattening the one of the plurality of segments includes expanding the segment bounding box by a radius of a maximum defect size to be evaluated.

15. The apparatus of claim 14 wherein the machine-accessible medium further includes instructions, that when executed by a machine, cause the machine to perform a method further comprising:

propagating net names across segment boundaries.

16. The apparatus of claim 15 wherein propagating net names includes extracting net equivalence pairs for the one of the plurality of segments and an adjacent segment;

merging net equivalence pairs to create one or more net equivalence classes;

identifying a representative net name for each net equivalence class; and propagating the representative net name for each net equivalence class to all nets in the net equivalence class.

17. The apparatus of claim 16 wherein the machine-accessible medium further includes instructions, that when executed by a machine, cause the machine to perform a method further comprising identifying potential faults in the flattened segment by weighted critical area, each potential fault having at least two associated net names; and after propagating the representative net name, deleting potential faults where all associated net names are the same.

18. An apparatus comprising:

a fault extraction front end to partially flatten a hierarchically described integrated circuit layout to produce an annotated list of rectangles for one of a plurality of segments of the integrated circuit layout;

a weighted critical area calculator to produce an intermediate list of critical areas for the segment; and a fault list stitcher to merge the intermediate list with a prior-generated list of critical areas.

19. The apparatus of claim 18 wherein, the fault list stitcher is further to propagate net names indicated by the annotated list of rectangles across segment boundaries.

20. The apparatus of claim 18 wherein, to partially flatten the hierarchically described integrated circuit layout, the fault extraction front end is further to determine a segment bounding box for the segment and to expand the segment bounding box by a radius of a maximum defect size to be evaluated prior to producing the annotated list of rectangles.

21. The apparatus of claim 20 wherein, the fault list stitcher is further capable of extracting net equivalence pairs for the segment and an adjacent segment.

22. The apparatus of claim 21 wherein, the fault list stitcher is further capable of merging extracted net equivalence pairs to create net equivalence classes.

23. The apparatus of claim 22 wherein, the fault list stitcher is further capable of identifying a representative net name for each net equivalence class; and propagating the representative net name to each net in the equivalence class.

24. The apparatus of claim 23 wherein to identify a representative net name, the fault list stitcher is capable of identifying the net name at the highest level of hierarchy in the integrated circuit layout.

25. The apparatus of claim 23 wherein the fault list stitcher is further capable of after the representative net name is propagated, deleting each critical area from the intermediate list for which all corresponding net names are the same.

* * * * *

UNITED STATES PATENT AND TRADEMARK OFFICE
CERTIFICATE OF CORRECTION

PATENT NO. : 6,598,211 B2  
DATED : July 22, 2003  
INVENTOR(S) : Zachariah et al.

Page 1 of 1

It is certified that error appears in the above-identified patent and that said Letters Patent is hereby corrected as shown below:

Column 5,  
Line 20, delete "layers" and insert -- layer --.

Column 8,  
Line 16, delete "into" and insert -- onto --.

Column 7,  
Line 40, delete "expanding" and insert -- expanded --.

Column 12,  
Line 10, delete "if" and insert -- is --.

Column 15,  
Line 46, after the word "coordinate", insert -- equal --.

Column 16,  
Line 60, delete "clinical" and insert -- critical --.

Signed and Sealed this

Seventh Day of September, 2004

JON W. DUDAS  
*Director of the United States Patent and Trademark Office*